United States Patent
Kim et al.

(10) Patent No.: US 9,268,217 B2
(45) Date of Patent: Feb. 23, 2016

(54) PHOTOSENSITIVE RESIN COMPOSITION AND LIGHT BLOCKING LAYER USING THE SAME

(71) Applicant: Cheil Industries Inc., Gumi-si (KR)

(72) Inventors: Seung-Hyun Kim, Uiwang-si (KR); Dong-Hoon Won, Uiwang-si (KR); Youn-Gi Lee, Uiwang-si (KR); Chang-Min Lee, Uiwang-si (KR); Hwan-Sung Cheon, Uiwang-si (KR); Seung-Jib Choi, Uiwang-si (KR); Min-Sung Kim, Uiwang-si (KR); Tae-Ho Kim, Uiwang-si (KR)

(73) Assignee: Cheil Industries Inc., Gumi-si (KR)

( * ) Notice: Subject to any disclaimer, the term of this patent is extended or adjusted under 35 U.S.C. 154(b) by 0 days.

(21) Appl. No.: 14/244,175

(22) Filed: Apr. 3, 2014

(65) Prior Publication Data

US 2015/0050595 A1 Feb. 19, 2015

(30) Foreign Application Priority Data

Aug. 9, 2013 (KR) .......... 10-2013-0094959
Oct. 4, 2013 (KR) .......... 10-2013-0118688

(51) Int. Cl.
*G03F 7/038* (2006.01)
*G03F 7/00* (2006.01)
*G03F 7/075* (2006.01)
*G03F 7/032* (2006.01)

(52) U.S. Cl.
CPC ............ *G03F 7/0007* (2013.01); *G03F 7/032* (2013.01); *G03F 7/0388* (2013.01); *G03F 7/0757* (2013.01)

(58) Field of Classification Search
None
See application file for complete search history.

(56) References Cited

U.S. PATENT DOCUMENTS

| | | | |
|---|---|---|---|
| 5,716,753 | A | 2/1998 | Yoshimoto et al. |
| 8,273,270 | B2 | 9/2012 | Lee et al. |
| 8,298,454 | B2 | 10/2012 | Lee et al. |
| 8,512,921 | B2 | 8/2013 | Lee et al. |
| 2008/0138725 | A1 | 6/2008 | Fujiwara et al. |
| 2011/0151195 | A1 | 6/2011 | Mitsukura et al. |
| 2011/0151379 | A1 | 6/2011 | Choi et al. |
| 2012/0091407 | A1* | 4/2012 | Lee et al. ............ 252/582 |
| 2012/0145971 | A1* | 6/2012 | Lee et al. ............ 252/582 |
| 2012/0161088 | A1* | 6/2012 | Choi et al. ........... 252/586 |

FOREIGN PATENT DOCUMENTS

| | | |
|---|---|---|
| JP | 09-015852 A | 1/1997 |
| JP | 10-010718 | 1/1998 |
| JP | 5046678 A | 9/2008 |
| JP | 2009-122224 A | 6/2009 |
| JP | 2010-128320 A | 6/2010 |
| JP | 2012-233048 A | 11/2012 |
| JP | 5096814 B2 | 12/2012 |
| JP | 2013-003310 A | 1/2013 |
| JP | 5188391 B2 | 4/2013 |
| JP | 2013-080206 A | 5/2013 |
| JP | 2013-134263 A | 7/2013 |
| KR | 10-1997-0007487 A | 2/1997 |
| KR | 10-0787715 A | 7/2007 |
| KR | 10-1036784 A | 12/2008 |
| KR | 10-1117997 A | 1/2009 |
| KR | 10-1002734 A | 3/2009 |
| KR | 10-2009-0049541 A | 5/2009 |
| KR | 10-2009-0062898 A | 6/2009 |
| KR | 10-2010-0066197 | 6/2010 |
| KR | 10-1068622 A | 6/2011 |
| KR | 10-2012-0045077 A | 5/2012 |
| KR | 10-2012-0105571 A | 9/2012 |
| KR | 10-2013-0003892 A | 1/2013 |
| KR | 10-2013-0016043 A | 2/2013 |
| KR | 10-2013-0032831 A | 4/2013 |
| KR | 10-2013-0079165 A | 7/2013 |
| TW | 2010-16815 | 5/2010 |

(Continued)

OTHER PUBLICATIONS

Cis-1,2,3,5-Tetrahydrophthalic anhydride 95%/ Sigma-Aldrich from 1 printed Jan. 10, 2015 from http://www.sigmaalddrich.com/catalog/product website online, 2 pages.*

*Primary Examiner* — Cynthia Hamilton
(74) *Attorney, Agent, or Firm* — Additon, Higgins & Pendleton, P.A.

(57) ABSTRACT

Disclosed are a photosensitive resin composition including (A) a binder resin represented by the following Chemical Formula 1; (B) a reactive unsaturated compound; (C) an initiator; (D) a pigment; and (E) a solvent, and a light blocking layer using the same, wherein, in the following Chemical Formula 1, each substituent is the same as defined in the detailed description.

[Chemical Formula 1]

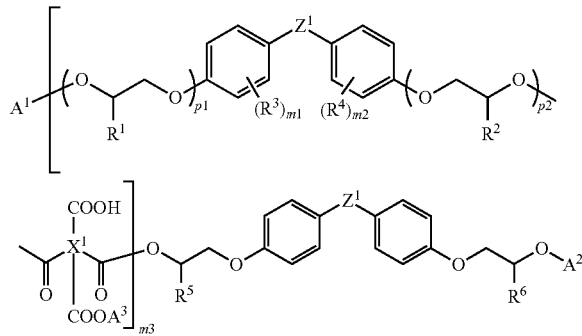

15 Claims, No Drawings

(56) References Cited

FOREIGN PATENT DOCUMENTS

| TW | 201016794 | 5/2010 |
| WO | 2007/129589 A1 | 11/2007 |
| WO | 2012/145330 A1 | 10/2012 |
| WO | 2013/018978 A1 | 2/2013 |

\* cited by examiner

PHOTOSENSITIVE RESIN COMPOSITION AND LIGHT BLOCKING LAYER USING THE SAME

CROSS-REFERENCE TO RELATED APPLICATION

This application claims priority to and the benefit of Korean Patent Application No. 10-2013-0094959 filed in the Korean Intellectual Property Office on Aug. 9, 2013, and Korean Patent Application No. 10-2013-0118688 filed in the Korean Intellectual Property Office on Oct. 4, 2013, the entire disclosure of each of which is incorporated herein by reference.

FIELD OF THE INVENTION

This disclosure relates to a photosensitive resin composition including a novel binder resin and a light blocking layer using the same.

BACKGROUND OF THE INVENTION

A liquid crystal display device includes a lower substrate including a color filter including a light blocking layer, a lower substrate on which an ITO pixel electrode is formed; an active circuit portion including a liquid crystal layer, a thin film transistor, and a capacitor layer; and an upper substrate on which an ITO pixel electrode is formed. The light blocking layer blocks uncontrolled light transmitted out of a transparent pixel electrode of a substrate and thus prevents contrast reduction due to light transmitted through a thin film transistor. Red, green, and blue light blocking layers transmit light with a predetermined wavelength of white light and display colors.

The light blocking layer is generally manufactured by a pigment dispersion method. The pigment dispersion method includes coating a transparent substrate with a colorant-containing photopolymerizable composition, exposing to provide a pattern by thermal curing, and removing non-exposed portions with a solvent.

However, when a photosensitive polyimide or phenol-based resin is used as a binder resin in the pigment dispersion method, high heat resistance may be obtained but sensitivity can be lowered and an organic solvent is required as a development solvent. A photoresist using an azide compound can have low sensitivity and heat resistance and may be affected by oxygen during exposure. Also, an acrylic-based resin can have good heat resistance, shrinkage-resistance, chemical resistance, and the like, but reduced sensitivity, developability, and close-contacting (adhesive) properties.

In addition, since black pigments are included in a large amount in order to adjust optical density of a light blocking layer, sensitivity, developability, and close-contacting properties may significantly deteriorate.

SUMMARY OF THE INVENTION

The present invention provides a photosensitive resin composition that can have excellent close-contacting (adhesion) properties and/or resolution.

The present invention also provides a light blocking layer manufactured using the photosensitive resin composition.

The photosensitive resin composition includes: (A) a binder resin represented by the following Chemical Formula 1; (B) a reactive unsaturated compound; (C) an initiator; (D) a pigment; and (E) a solvent.

[Chemical Formula 1]

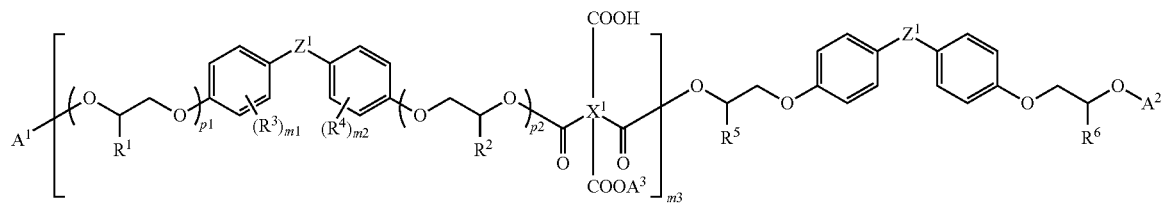

In the above Chemical Formula 1, $A^1$ to $A^3$ are the same or different and are each independently hydrogen represented by the following Chemical Formula 2-1 or represented by the following Chemical Formula 2-2, with the proviso that at least one of $A^1$ to $A^3$ is represented by the following Chemical Formula 2-1, and each $Z^1$ is the same or different and each is independently a single bond, O, CO, $SO_2$, CR'R'', SiR'''R'''' (wherein R' to R'''' are the same or different and are each independently hydrogen or substituted or unsubstituted C1 to C20 alkyl), or one of linking groups represented by the following Chemical Formulae 1-1 to 1-11.

[Chemical Formula 1-1]

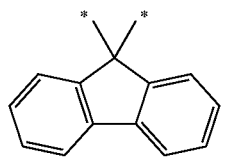

[Chemical Formula 1-2]

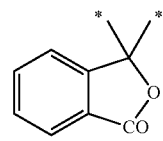

[Chemical Formula 1-3]

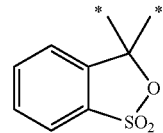

[Chemical Formula 1-4]

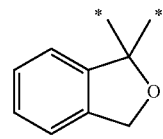

-continued

[Chemical Formula 1-5]

In the above Chemical Formula 1-5, $R^a$ is hydrogen, ethyl, $C_2H_4Cl$, $C_2H_4OH$, $CH_2CH=CH_2$, or phenyl.

[Chemical Formula 1-6]

[Chemical Formula 1-7]

[Chemical Formula 1-8]

[Chemical Formula 1-9]

[Chemical Formula 1-10]

[Chemical Formula 1-11]

each $X^1$ is the same or different and each is independently an acid dianhydride residual group, $R^1$ to $R^6$ are the same or different and are each independently hydrogen, halogen, substituted or unsubstituted C1 to C30 alkyl, or substituted or unsubstituted (meth)acrylate, m1 and m2 are the same or different and are each independently integers of 0 to 4, m3 is an integer of 1 to 20, and p1 and p2 are the same or different and are each independently integers of 1 to 10.

[Chemical Formula 2-1]

[Chemical Formula 2-2]

In the above Chemical Formulae 2-1 and 2-2, $R^7$ to $R^9$ are the same or different and are each independently hydrogen, a hydroxy group, a carboxyl group, substituted or unsubstituted C1 to C30 alkyl, or substituted or unsubstituted C6 to C30 aryl, $R^{10}$ is substituted or unsubstituted C1 to C30 alkyl or substituted or unsubstituted C6 to C30 aryl, $L^1$ to $L^3$ are the same or different and are each independently a single bond, a carbonyl group (—C(=O)—), substituted or unsubstituted C1 to C30 alkylene, or substituted or unsubstituted C6 to C30 arylene, $Y^1$ is a divalent or trivalent C1 to C30 aliphatic organic group, a divalent or trivalent C3 to C30 alicyclic organic group, a divalent or trivalent C6 to C30 aromatic organic group, or a combination thereof, and n1 is an integer of 0 or 1.

The $A^1$ and $A^2$ may be independently represented by the following Chemical Formula 3.

[Chemical Formula 3]

In the above Chemical Formula 3, $L^3$ is independently a single bond, a carbonyl group (—C(=O)—), substituted or unsubstituted C1 to C30 alkylene, or substituted or unsubstituted C6 to C30 arylene, and $R^8$ and $R^9$ are the same or different and are each independently a hydroxy group, a carboxyl group, substituted or unsubstituted C1 to C30 alkyl, or substituted or unsubstituted C6 to C30 aryl.

The binder resin may be represented by the following Chemical Formula 4 and/or Chemical Formula 5.

[Chemical Formula 4]

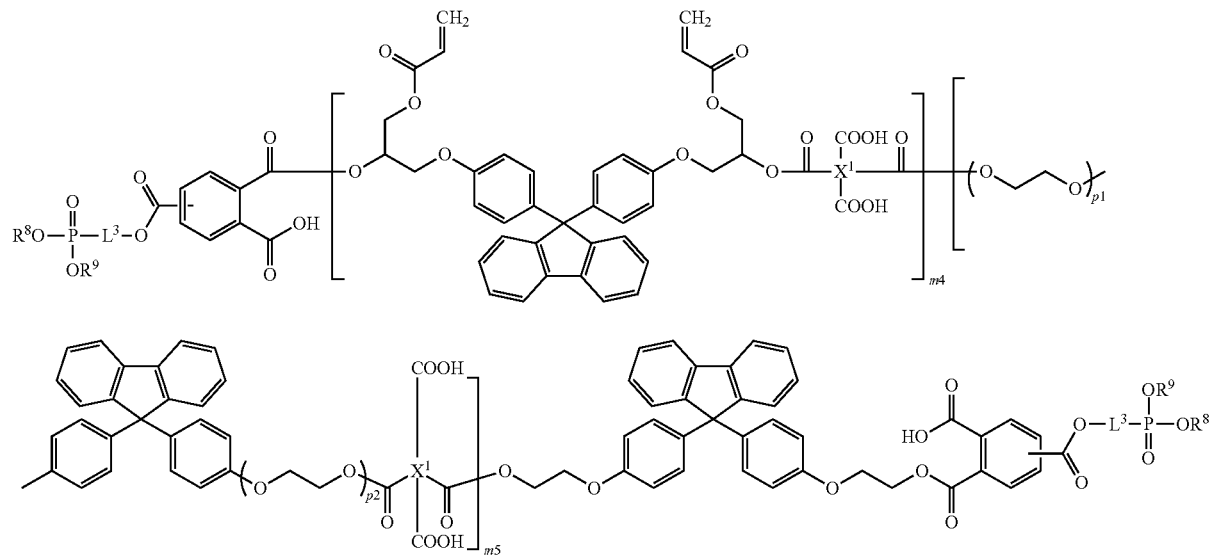

[Chemical Formula 5]

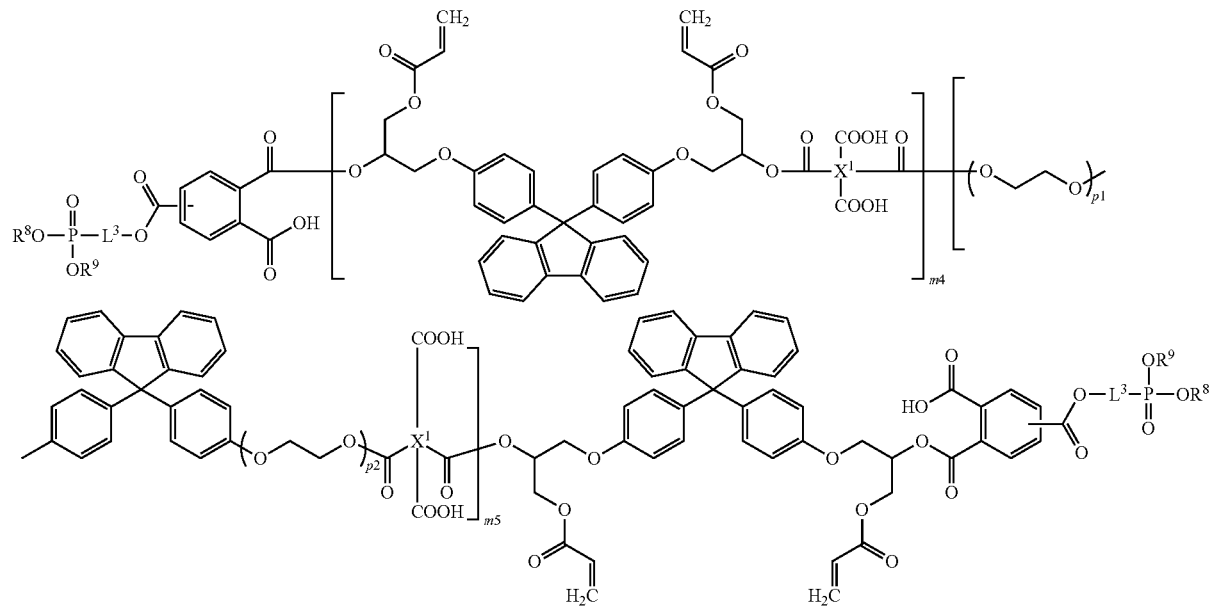

In the above Chemical Formulae 4 and 5, each $X^1$ is the same or different and is each an acid dianhydride residual group, each $L^3$ is the same or different and is each independently a single bond, a carbonyl group (—C(=O)—), substituted or unsubstituted C1 to C30 alkylene, or substituted or unsubstituted C6 to C30 arylene, $R^8$ and $R^9$ are the same or different and are each independently a hydroxy group, a carboxyl group, substituted or unsubstituted C1 to C30 alkyl, or substituted or unsubstituted C6 to C30 aryl, m4 is an integer of 1 to 20, m5 is an integer of 0 to 20, and p1 and p2 are the same or different and are each independently integers of 1 to 10.

The $A^3$ may be represented by the following Chemical Formula 3 or Chemical Formula 6.

[Chemical Formula 3]

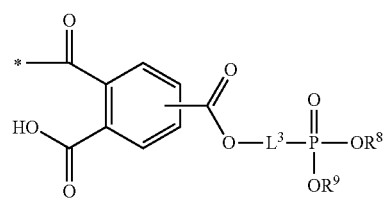

[Chemical Formula 6]

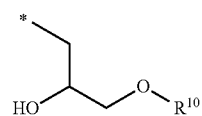

In the above Chemical Formulae 3 and 6, $L^3$ is independently a single bond, a carbonyl group (—C(=O)—), substituted or unsubstituted C1 to C30 alkylene, or substituted or unsubstituted C6 to C30 arylene, $R^8$ and $R^9$ are the same or different and are each independently a hydroxy group, a carboxyl group, substituted or unsubstituted C1 to C30 alkyl or substituted or unsubstituted C6 to C30 aryl, and $R^{10}$ is substituted or unsubstituted C1 to C30 alkyl or substituted or unsubstituted C6 to C30 aryl.

The binder resin may have a weight average molecular weight of about 500 g/mol to about 50,000 g/mol.

In the above Chemical Formula 2-1, when n1 is an integer of 0, $Y^1$ may be represented by the following Chemical Formulae 7-1 to 7-7.

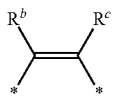
[Chemical Formula 7-1]

In the above Chemical Formula 7-1, $R^b$ and $R^c$ are the same or different and are each independently hydrogen, substituted or unsubstituted C1 to C20 alkyl, an ester group, or an ether group.

[Chemical Formula 7-2]

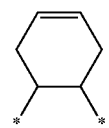
[Chemical Formula 7-3]

[Chemical Formula 7-4]

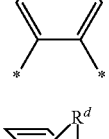
[Chemical Formula 7-5]

In the above Chemical Formula 7-5, $R^d$ is O, S, NH, a substituted or unsubstituted C1 to C20 alkylene group, C1 to C20 alkylamine group, or a C2 to C20 allylamine group.

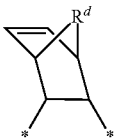
[Chemical Formula 7-6]

[Chemical Formula 7-7]

The binder resin may be a cardo-based resin.

The photosensitive resin composition may further include an acrylic-based resin.

The acrylic-based resin may have a weight average molecular weight of about 3,000 g/mol to about 40,000 g/mol.

The cardo-based resin and the acrylic-based resin may be included in a weight ratio of about 99:1 to about 30:70.

The initiator may be a photopolymerization initiator, a radical polymerization initiator, or a combination thereof.

The photosensitive resin composition may include (A) about 1 wt % to about 30 wt % of the binder resin; (B) about 1 wt % to about 40 wt % of the reactive unsaturated compound; (C) about 0.01 wt % to about 10 wt % of the initiator; (D) about 1 wt % to about 50 wt % of the pigment; and (E) a balance amount of the solvent.

The photosensitive resin composition may further include malonic acid; 3-amino-1,2-propanediol; a silane-based coupling agent having a vinyl group or a (meth)acryloxy group; a leveling agent; a surfactant; a radical polymerization initiator; or a combination thereof.

The photosensitive resin composition may further include about 0.01 to about 20 parts by weight of an epoxy compound based on about 100 parts by weight of the photosensitive resin composition.

The present invention also provides a light blocking layer manufactured using the photosensitive resin composition.

The photosensitive resin composition can have improved close-contacting properties, resolution, sensitivity, developability, heat resistance, shrinkage resistance, chemical resistance, and/or taper characteristics, and may be usefully applied to a light blocking layer, and the like.

DETAILED DESCRIPTION

The present invention now will be described more fully hereinafter in the following detailed description of the invention, in which some, but not all embodiments of the invention are described. Indeed, this invention may be embodied in many different forms and should not be construed as limited to the embodiments set forth herein; rather, these embodiments are provided so that this disclosure will satisfy applicable legal requirements.

As used herein, when a specific definition is not otherwise provided, the term "alkyl" refers to C1 to C20 alkyl, the term "alkenyl" refers to C2 to C20 alkenyl, the term "cycloalkenyl" refers to C3 to C20 cycloalkenyl, the term "heterocycloalkenyl" refers to C3 to C20 heterocycloalkenyl, the term "aryl" refers to C6 to C20 aryl, the term "arylalkyl" refers to C6 to C20 arylalkyl, the term "alkylene" refers to C1 to C20 alkylene, the term "arylene" refers to C6 to C20 arylene, the term "alkylarylene" refers to C6 to C20 alkylarylene, the term "heteroarylene" refers to C3 to C20 heteroarylene, and the term "alkoxylene" refers to C1 to C20 alkoxylene.

As used herein, when a specific definition is not otherwise provided, the term "substituted" refers to one substituted with a substituent including a halogen atom (F, Cl, Br, I), a hydroxy group, a C1 to C20 alkoxy group, a nitro group, a cyano group, an amine group, an imino group, an azido group, an amidino group, a hydrazino group, a hydrazono group, a carbonyl group, a carbamyl group, a thiol group, an ester group, an ether group, a carboxyl group or a salt thereof, a sulfonic acid group or a salt thereof, a phosphoric acid or a salt thereof, C1 to C20 alkyl, C2 to C20 alkenyl, C2 to C20 alkynyl, C6 to C20 aryl, C3 to C20 cycloalkyl, C3 to C20 cycloalkenyl, C3 to C20 cycloalkynyl, C2 to C20 heterocycloalkyl, C2 to C20 heterocycloalkenyl, C2 to C20 heterocycloalkynyl, C3 to C20 heteroaryl, or a combination thereof, instead of at least one hydrogen.

As used herein, when a specific definition is not otherwise provided, the term "divalent or trivalent C1 to C30 aliphatic organic group" may refer to C1 to C30 alkyl, C2 to C30 alkenyl, C2 to C30 alkynyl, C1 to C30 alkylene, C2 to C30 alkenylene, or C2 to C30 alkynylene, for example C1 to C15 alkyl, C2 to C15 alkenyl, C2 to C15 alkynyl, C1 to C15 alkylene, C2 to C15 alkenylene, or C2 to C15 alkynylene, the term "divalent or trivalent C3 to C30 alicyclic organic group" may refer to C3 to C30 cycloalkyl, C3 to C30 cycloalkenyl, C3 to C30 cycloalkynyl, C3 to C30 cycloalkylene, C3 to C30 cycloalkenylene, or C3 to C30 cycloalkynylene, for example C3 to C15 cycloalkyl, C3 to C15 cycloalkenyl, C3 to C15 cycloalkynyl, C3 to C15 cycloalkylene, C3 to C15 cycloalkenylene, or C3 to C15 cycloalkynylene, and the term "divalent or trivalent C6 to C30 aromatic organic group" may refer to C6 to C30 aryl or C6 to C30 arylene, for example C6 to C16 aryl or C6 to C16 arylene.

As used herein, when a specific definition is not otherwise provided, the term "hetero" refers to one including at least one heteroatom including N, O, S and/or P in a chemical formula.

As used herein, when a specific definition is not otherwise provided, "(meth)acrylate" refers to both "acrylate" and "methacrylate", and "(meth)acrylic acid" refers to "acrylic acid" and "methacrylic acid".

As used herein, when a specific definition is not otherwise provided, the term "combination" refers to a mixture or a copolymerization.

As used herein, unless a specific definition is otherwise provided, a hydrogen atom is bonded at a position when a chemical bond is not drawn.

As used herein, when a specific definition is not otherwise provided, an unsaturated bond refers to a bond including another atom such as a carbonyl bond, an azo bond as well as a multiple bond between carbon-carbon atoms.

As used herein, a cardo-based resin refers to a resin including at least one functional group selected from the following Chemical Formulae 1-1 to 1-11 in a backbone.

As used herein, when specific definition is not otherwise provided, "*" indicates a point where the same or different atom or chemical formula is linked.

A photosensitive resin composition according to one aspect includes (A) a binder resin, (B) a reactive unsaturated compound, (C) an initiator, (D) a pigment, and (E) a solvent. The binder resin may improve a close-contacting force to a substrate due to a substituent represented by the following Chemical Formula 2-1 and/or Chemical Formula 2-2, and thereby improved resolution may be realized.

Hereinafter, each component is specifically described.

(A) Binder Resin

The binder resin is represented by the following Chemical Formula 1.

[Chemical Formula 1]

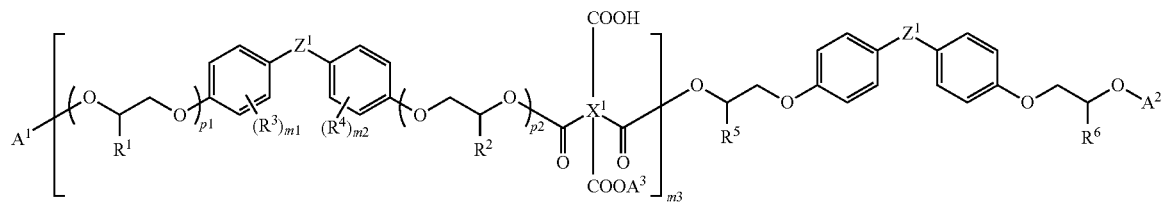

In the above Chemical Formula 1, $A^1$ to $A^3$ are the same or different and are each independently hydrogen represented by the following Chemical Formula 2-1, or represented by the following Chemical Formula 2-2, with the proviso that at least one of $A^1$ to $A^3$ is represented by the following Chemical Formula 2-1, and each $Z^1$ is the same or different and each is independently a single bond, O, CO, $SO_2$, CR'R", SiR'''R'''' (wherein R' to R'''' are the same or different and are each independently hydrogen or substituted or unsubstituted C1 to C20 alkyl), or one of linking groups represented by the following Chemical Formulae 1-1 to 1-11.

[Chemical Formula 1-1]

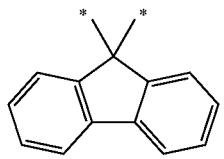

[Chemical Formula 1-2]

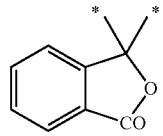

[Chemical Formula 1-3]

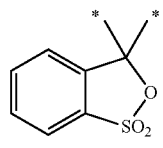

[Chemical Formula 1-4]

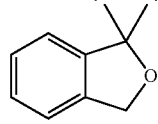

[Chemical Formula 1-5]

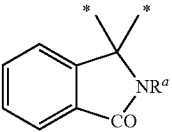

In the above Chemical Formula 1-5, $R^a$ is hydrogen, ethyl, $C_2H_4Cl$, $C_2H_4OH$, $CH_2CH=CH_2$, or phenyl,

[Chemical Formula 1-6]

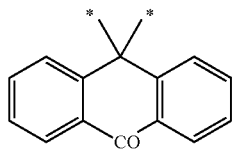

[Chemical Formula 1-7]

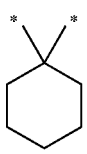

[Chemical Formula 1-8]

[Chemical Formula 1-9]

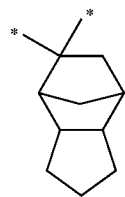

[Chemical Formula 1-10]

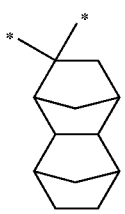

[Chemical Formula 1-11]

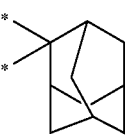

each $X^1$ is the same or different and each is independently an acid dianhydride residual group, $R^1$ to $R^6$ are the same or different and are each independently hydrogen, halogen, substituted or unsubstituted C1 to C30 alkyl, or substituted or unsubstituted (meth)acrylate, m1 and m2 are the same or different and are each independently integers of 0 to 4, m3 is an integer of 1 to 20, and p1 and p2 are the same or different and are each independently integers of 1 to 10.

[Chemical Formula 2-1]

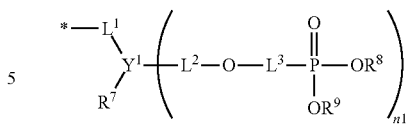

[Chemical Formula 2-2]

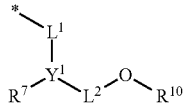

In the above Chemical Formulae 2-1 and 2-2, $R^7$ to $R^9$ are the same or different and are each independently hydrogen, a hydroxy group, a carboxyl group, substituted or unsubstituted C1 to C30 alkyl, or substituted or unsubstituted C6 to C30 aryl, $R^{10}$ is substituted or unsubstituted C1 to C30 alkyl or substituted or unsubstituted C6 to C30 aryl, $L^1$ to $L^3$ are the same or different and are each independently a single bond, a carbonyl group (—C(=O)—), substituted or unsubstituted C1 to C30 alkylene, or substituted or unsubstituted C6 to C30 arylene, $Y^1$ is a divalent or trivalent C1 to C30 aliphatic organic group, a divalent or trivalent C3 to C30 alicyclic organic group, a divalent or trivalent C6 to C30 aromatic organic group, or a combination thereof, and n1 is an integer of 0 or 1.

The binder resin represented by the above Chemical Formula 1 can include (meth)acrylate at $R^1$ and/or $R^2$ positions and also the substituents represented by the above Chemical Formula 2-1 and/or Chemical Formula 2-2 at $A^1$ to $A^3$ positions, and thereby a close-contacting force between the photosensitive resin composition and a substrate may be improved and resolution may be also improved.

The $A^1$ and $A^2$ are independently represented by the following Chemical Formula 3.

[Chemical Formula 3]

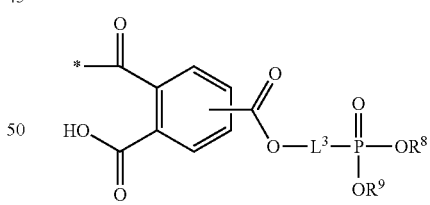

In the above Chemical Formula 3, $L^3$ is independently a single bond, a carbonyl group (—C(=O)—), substituted or unsubstituted C1 to C30 alkylene, or substituted or unsubstituted C6 to C30 arylene, and $R^8$ and $R^9$ are the same or different and are each independently a hydroxy group, a carboxyl group, substituted or unsubstituted C1 to C30 alkyl, or substituted or unsubstituted C6 to C30 aryl.

For example, the binder resin represented by the above Chemical Formula 1 may be represented by the following Chemical Formula 4 or Chemical Formula 5.

[Chemical Formula 4]

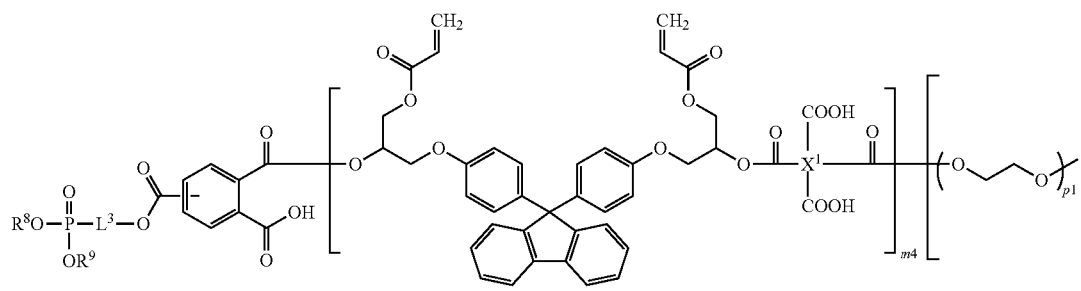

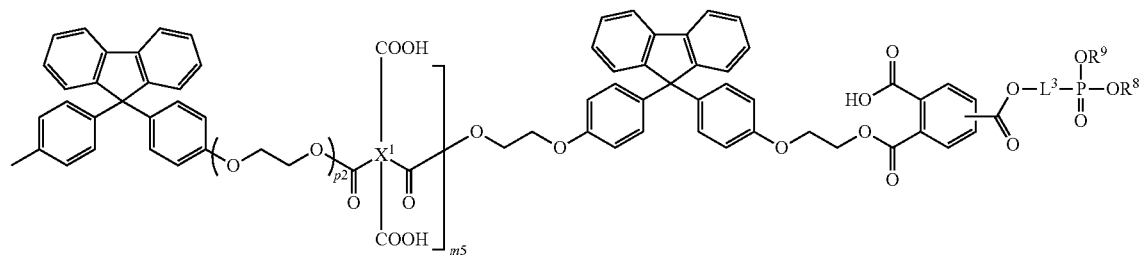

[Chemicl Formula 5]

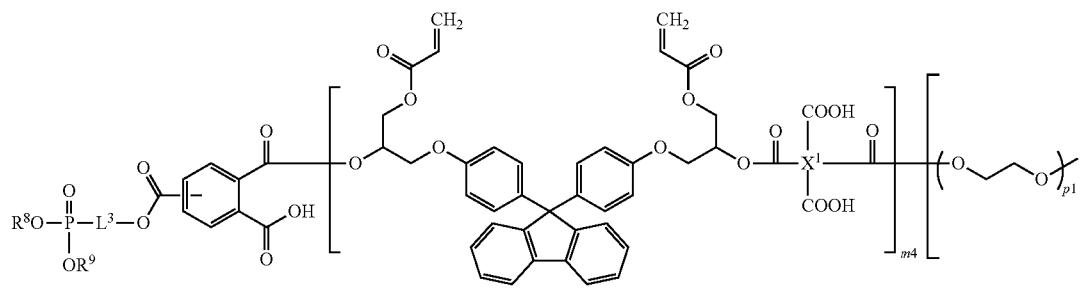

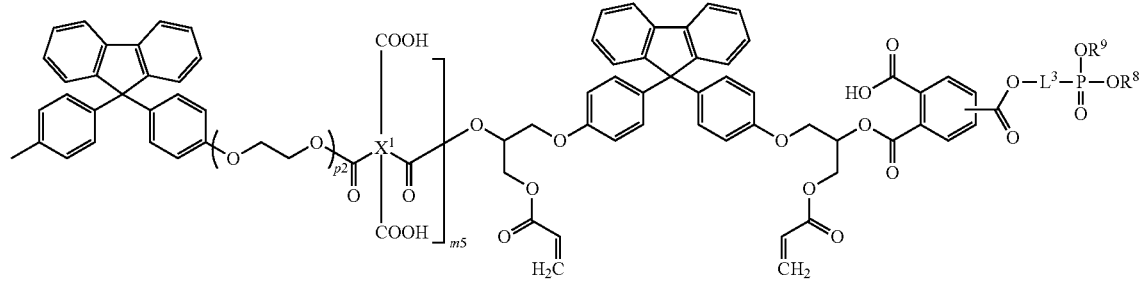

In the above Chemical Formulae 4 and 5, each $X^1$ is the same or different and is each an acid dianhydride residual group, each $L^3$ is the same or different and is each independently a single bond, a carbonyl group (—C(=O)—), substituted or unsubstituted C1 to C30 alkylene, or substituted or unsubstituted C6 to C30 arylene, $R^8$ and $R^9$ are the same or different and are each independently a hydroxy group, a carboxyl group, substituted or unsubstituted C1 to C30 alkyl or substituted or unsubstituted C6 to C30 aryl, m4 is an integer of 1 to 20, m5 is an integer of 0 to 20, and p1 and p2 are the same or different and are each independently integers of 1 to 10.

The $A^3$ may be represented by the above Chemical Formula 3 or the following Chemical Formula 6.

[Chemical Formula 6]

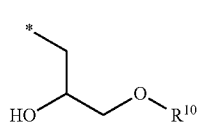

In the above Chemical Formula 6, $R^{10}$ is substituted or unsubstituted C1 to C30 alkyl or substituted or unsubstituted C6 to C30 aryl.

The binder resin may have a weight average molecular weight of about 500 to about 50,000 g/mol, for example about 1,000 to about 50,000 g/mol. When the binder resin has a weight average molecular weight within the above range, a pattern may be well formed with minimal or no residue during manufacture of a light blocking layer and without loss of a film thickness during development.

In the above Chemical Formula 2-1, when n1 is an integer of 0, $Y^1$ may be represented by the following Chemical Formulae 7-1 to 7-7. For example, the n1 is 0, and $Y^1$ may be represented by the following Chemical Formulae 7-1 to 7-7.

[Chemical Formula 7-1]

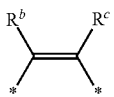

In the above Chemical Formula 7-1, $R^b$ and $R^c$ are the same or different and are each independently hydrogen, substituted or unsubstituted C1 to C20 alkyl, an ester group, or an ether group.

[Chemical Formula 7-2]

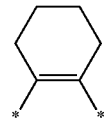

[Chemical Formula 7-3]

[Chemical Formula 7-4]

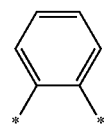

[Chemical Formula 7-5]

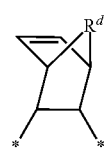

In the above Chemical Formula 7-5, $R^d$ is O, S, NH, a substituted or unsubstituted C1 to C20 alkylene group, C1 to C20 alkylamine group, or a C2 to C20 allylamine group.

[Chemical Formula 7-6]

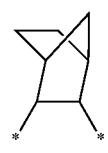

[Chemical Formula 7-7]

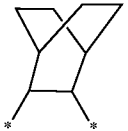

For example, the binder resin may be a cardo-based resin.

The cardo-based resin may be prepared by mixing at least two of a fluorine-containing compound such as 9,9-bis(4-oxiranylmethoxyphenyl)fluorene and the like; an anhydride compound such as benzenetetracarboxylic acid dianhydride, naphthalenetetracarboxylic acid dianhydride, biphenyltetracarboxylic acid dianhydride, benzophenonetetracarboxylic acid dianhydride, pyromellitic dianhydride, cyclobutanetetracarboxylic acid dianhydride, perylenetetracarboxylic acid dianhydride, tetrahydrofurantetracarboxylic acid dianhydride, tetrahydrophthalic anhydride, and the like; a glycol compound such as ethylene glycol, propylene glycol, polyethylene glycol and the like; an alcohol compound such as methanol, ethanol, propanol, n-butanol, cyclohexanol, benzyl alcohol, and the like; a solvent compound such as propylene glycol methylethylacetate, N-methylpyrrolidone, and the like; a phosphorus compound such as triphenylphosphine, and the like; and an amine or ammonium salt compound such as tetramethylammonium chloride, tetraethylammonium bromide, benzyldiethylamine, triethylamine, tributylamine, benzyltriethyl ammonium chloride, and the like.

The photosensitive resin composition may further include an acrylic-based resin in addition to the cardo-based resin. The acrylic-based resin is a copolymer of a first ethylenic unsaturated monomer and a second ethylenic unsaturated monomer that is copolymerizable therewith, and is a resin including at least one acrylic-based repeating unit.

The first ethylenic unsaturated monomer is an ethylenic unsaturated monomer including at least one carboxyl group. Examples of the monomer include without limitation (meth)acrylic acid, maleic acid, itaconic acid, fumaric acid, and the like, and combinations thereof.

The acrylic-based resin may include the first ethylenic unsaturated monomer in an amount of about 5 wt % to about 50 wt %, for example about 10 wt % to about 40 wt %, based on the total amount (total weight or 100 wt %) of the acrylic-based resin.

Examples of the second ethylenic unsaturated monomer may include without limitation aromatic vinyl compounds such as styrene, α-methylstyrene, vinyl toluene, vinylbenzylmethylether and the like; unsaturated carboxylate ester compounds such as methyl(meth)acrylate, ethyl(meth)acrylate, butyl(meth)acrylate, 2-hydroxyethyl(meth)acrylate, 2-hydroxy butyl(meth)acrylate, benzyl(meth)acrylate, cyclohexyl (meth)acrylate, phenyl(meth)acrylate, and the like; unsaturated carboxylic acid amino alkyl ester compounds such as 2-aminoethyl(meth)acrylate, 2-dimethylaminoethyl(meth)acrylate, and the like; carboxylic acid vinyl ester compounds such as vinyl acetate, vinyl benzoate, and the like; unsaturated carboxylic acid glycidyl ester compounds such as glycidyl (meth)acrylate, and the like; vinyl cyanide compounds such as (meth)acrylonitrile and the like; unsaturated amide compounds such as (meth)acrylamide, and the like; and the like. These may be used singularly or as a mixture of two or more.

Specific examples of the acrylic-based resin may include without limitation an acrylic acid/benzylmethacrylate copolymer, a methacrylic acid/benzylmethacrylate copolymer, a methacrylic acid/benzyl methacrylate/styrene copolymer, a methacrylic acid/benzylmethacrylate/2-hydroxyethylmethacrylate copolymer, a methacrylic acid/benzylmethacrylate/styrene/2-hydroxyethylmethacrylate copolymer, and the like. These may be used singularly or as a mixture of two or more.

The acrylic-based resin may have a weight average molecular weight of about 3,000 g/mol to about 150,000 g/mol, for example about 3,000 g/mol to about 40,000 g/mol, and as another example about 5,000 g/mol to about 30,000 g/mol. When the acrylic-based resin has a weight average molecular weight within the above range, the photosensitive resin composition may have excellent physical and/or chemical properties and/or an appropriate viscosity, maintain appropriate developability and/or sensitivity, and/or show an excellent close-contacting force to a substrate during manufacture of a light blocking layer.

The acrylic-based resin may have an acid value of about 20 mgKOH/g to about 200 mgKOH/g, for example about 50 mgKOH/g to about 150 mgKOH/g. When the acrylic-based resin has an acid value within the above range, a pixel pattern may maintain developability and thus may have excellent resolution.

When the acrylic-based resin is included in the photosensitive resin composition, the cardo-based resin and the acrylic-based resin may be used in a weight ratio of about 99:1 to about 30:70, for example, about 95:5 to about 50:50.

In some embodiments, the cardo-based resin and the acrylic-based resin may include the cardo-based resin in an amount of about 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, 80, 81, 82, 83, 84, 85, 86, 87, 88, 89, 90, 91, 92, 93, 94, 95, 96, 97, 98, or 99 wt %. Further, according to some embodiments of the present invention, the amount of the cardo-based resin can be in a range from about any of the foregoing amounts to about any other of the foregoing amounts.

In some embodiments, the cardo-based resin and the acrylic-based resin may include the acrylic-based resin in an amount of about 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, or 70 wt %. Further, according to some embodiments of the present invention, the amount of the acrylic-based resin can be in a range from about any of the foregoing amounts to about any other of the foregoing amounts.

When the cardo-based resin and acrylic-based resin are included in amounts within the above weight ratio range, a light blocking layer pattern having excellent tapering characteristics as well as maintaining excellent developability and sensitivity may be formed, and an undercut may also be prevented.

The photosensitive resin composition may include the binder resin in an amount of about 1 wt % to about 30 wt %, for example about 3 wt % to about 20 wt %, based on the total amount (total weight or 100 wt %) of the photosensitive resin composition. In some embodiments, the photosensitive resin composition may include the binder resin in an amount of about 1, 2, 3, 4, 5, 6, 7, 8, 9, 10, 11, 12, 13, 14, 15, 16, 17, 18, 19, 20, 21, 22, 23, 24, 25, 26, 27, 28, 29, or 30 wt %. Further, according to some embodiments of the present invention, the amount of the binder resin can be in a range from about any of the foregoing amounts to about any other of the foregoing amounts.

When the binder resin is included in an amount within the above range, excellent sensitivity, developability and/or close-contacting properties may be provided.

(B) Reactive Unsaturated Compound

The reactive unsaturated compound may be a generally-used monomer and/or oligomer in a photosensitive resin composition. The reactive unsaturated compound may include a mono-functional and/or multi-functional ester of (meth)acrylic acid including at least one ethylenic unsaturated double bond.

The reactive unsaturated compound has an ethylenic unsaturated double bond and thus may cause sufficient polymerization during exposure in a pattern-forming process and form a pattern having excellent heat resistance, light resistance, and/or chemical resistance.

Examples of the reactive unsaturated compound may include without limitation ethylene glycol diacrylate, ethylene glycol dimethacrylate, diethylene glycol diacrylate, triethylene glycol diacrylate, triethylene glycol dimethacrylate, 1,6-hexanediol diacrylate, 1,6-hexanediol dimethacrylate, pentaerythritol triacrylate, pentaerythritol tetraacrylate, dipentaerythritol pentaacrylate, dipentaerythritol hexaacrylate, bisphenol A epoxyacrylate, ethylene glycolmonomethylether acrylate, trimethylolpropane triacrylate, trisacryloyloxyethyl phosphate, and the like, and combinations thereof.

Commercially available examples of the reactive unsaturated compound include the following. Examples of the mono-functional (meth)acrylic acid ester may include without limitation Aronix M-101®, M-111®, and/or M-114® (Toagosei Chemistry Industry Co., Ltd.); KAYARAD TC-110S® and/or TC-120S® (Nippon Kayaku Co., Ltd.); V-158® and/or V-2311® (Osaka Organic Chemical Ind., Ltd.), and the like. Examples of a difunctional (meth)acrylic acid ester may include without limitation Aronix M-210®, M-240®, and/or M-6200® (Toagosei Chemistry Industry Co., Ltd.), KAYARAD HDDA®, HX-220®, and/or R-604® (Nippon Kayaku Co., Ltd.), V-260®, V-312®, and/or V-335 HP® (Osaka Organic Chemical Ind., Ltd.), and the like. Examples of a tri-functional (meth)acrylic acid ester may include without limitation Aronix M-309®, M-400®, M-405®, M-450®, M-7100®, M-8030®, and/or M-8060® (Toagosei Chemistry Industry Co., Ltd.), KAYARAD TMPTA®, DPCA-20®, DPCA-30®, DPCA-60®, and/or DPCA-120® (Nippon Kayaku Co., Ltd.), V-295®, V-300®, V-360®, V-GPT®, V-3PA®, and/or V-400® (Osaka Yuki Kayaku Kogyo Co. Ltd.), and the like. These may be used singularly or as a mixture of two or more.

The reactive unsaturated compound may be treated with acid anhydride to improve developability.

The photosensitive resin composition may include the reactive unsaturated compound in an amount of about 1 wt % to about 40 wt %, for example about 1 wt % to about 20 wt %, based on the total amount (total weight or 100 wt %) of the photosensitive resin composition. In some embodiments, the photosensitive resin composition may include the reactive unsaturated compound in an amount of about 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, or 40 wt %. Further, according to some embodiments of the present invention, the amount of the reactive unsaturated compound can be in a range from about any of the foregoing amounts to about any other of the foregoing amounts.

When the reactive unsaturated compound is included in an amount within the above range, the reactive unsaturated compound can be sufficiently cured during exposure in a pattern-forming process and can have excellent reliability and thus may form a pattern having excellent heat resistance, light resistance, and/or chemical resistance and also, excellent resolution and/or close-contacting properties.

(C) Initiator

The initiator may be a photopolymerization initiator, a radical polymerization initiator, or a combination thereof.

The photopolymerization initiator may be a generally-used photopolymerization initiator in a photosensitive resin composition. Examples of the photopolymerization initiator may include without limitation acetophenone-based compounds, benzophenone-based compounds, thioxanthone-based compounds, benzoin-based compounds, oxime-based compounds, and the like, and combinations thereof.

Examples of the acetophenone-based compound may include without limitation 2,2'-diethoxy acetophenone, 2,2'-dibutoxy acetophenone, 2-hydroxy-2-methylpropinophenone, p-t-butyltrichloro acetophenone, p-t-butyldichloro acetophenone, 4-chloro acetophenone, 2,2'-dichloro-4-phenoxy acetophenone, 2-methyl-1-(4-(methylthio)phenyl)-2-morpholinopropan-1-one, 2-benzyl-2-dimethylamino-1-(4-morpholinophenyl)-butan-1-one, and the like, and combinations thereof.

Examples of the benzophenone-based compound may include without limitation benzophenone, benzoyl benzoate, methyl benzoyl benzoate, 4-phenyl benzophenone, hydroxy benzophenone, acrylated benzophenone, 4,4'-bis(dimethylamino)benzophenone, 4,4'-bis(diethylamino)benzophenone, 4,4'-dimethylaminobenzophenone, 4,4'-dichlorobenzophenone, 3,3'-dimethyl-2-methoxybenzophenone, and the like, and combinations thereof.

Examples of the thioxanthone-based compound may include without limitation thioxanthone, 2-chlorothioxanthone, 2-methylthioxanthone, isopropyl thioxanthone, 2,4-diethyl thioxanthone, 2,4-diisopropyl thioxanthone, 2-chlorothioxanthone, and the like, and combinations thereof.

Examples of the benzoin-based compound may include without limitation benzoin, benzoin methyl ether, benzoin ethyl ether, benzoin isopropyl ether, benzoin isobutyl ether, benzyldimethylketal, and the like, and combinations thereof.

Examples of the triazine-based compound may include without limitation 2,4,6-trichloro-s-triazine, 2-phenyl-4,6-bis(trichloromethyl)-s-triazine, 2-(3',4'-dimethoxystyryl)-4,6-bis(trichloromethyl)-s-triazine, 2-(4'-methoxynaphthyl)-4,6-bis(trichloromethyl)-s-triazine, 2-(p-methoxyphenyl)-4,6-bis(trichloromethyl)-s-triazine, 2-(p-tolyl)-4,6-bis(trichloro methyl)-s-triazine, 2-biphenyl-4,6-bis(trichloro methyl)-s-triazine, bis(trichloromethyl)-6-styryl-s-triazine, 2-(naphtho1-yl)-4,6-bis(trichloromethyl)-s-triazine, 2-(4-methoxynaphtho1-yl)-4,6-bis(trichloromethyl)-s-triazine, 2-4-bis(trichloromethyl)-6-piperonyl-s-triazine, 2-4-bis(trichloromethyl)-6-(4-methoxystyryl)-s-triazine, and the like, and combinations thereof.

Examples of the oxime-based compound may include without limitation O-acyloxime-based compounds, 2-(O-benzoyloxime)-1-[4-(phenylthio)phenyl]-1,2-octandione, 1-(O-acetyloxime)-1-[9-ethyl-6-(2-methylbenzoyl)-9H-carbazol-3-yl]ethanone, O-ethoxycarbonyl-α-oxyamino-1-phenylpropan-1-one, and the like, and combinations thereof. Specific examples of the O-acyloxime-based compound may include without limitation 1,2-octandione, 2-dimethylamino-2-(4-methylbenzyl)-1-(4-morpholin-4-yl-phenyl)butan-1-one, 1-(4-phenylsulfanyl phenyl)-butane-1,2-dione 2-oxime-O-benzoate, 1-(4-phenylsulfanyl phenyl)-octane-1,2-dione 2-oxime-O-benzoate, 1-(4-phenylsulfanyl phenyl)-octan-1-one oxime-O-acetate, 1-(4-phenylsulfanyl phenyl)-butan-1-one oxime-O-acetate, and the like, and combinations thereof.

The photopolymerization initiator may further include a carbazole-based compound, a diketone-based compound, a sulfonium borate-based compound, a diazo-based compound, an imidazole-based compound, a biimidazole-based compound, and the like and combinations thereof in addition to or as an alternative to the above photopolymerization initiators.

Examples of the radical polymerization initiator may include without limitation peroxide-based compounds, azobis-based compounds, and the like, and combinations thereof.

Examples of the peroxide-based compound may include without limitation ketone peroxides such as methylethylketone peroxide, methylisobutylketone peroxide, cyclohexanone peroxide, methylcyclohexanone peroxide, acetylacetone peroxide, and the like; diacyl peroxides such as isobutyryl peroxide, 2,4-dichlorobenzoyl peroxide, o-methylbenzoyl peroxide, bis-3,5,5-trimethylhexanoyl peroxide, and the like; hydro peroxides such as 2,4,4,-trimethylpentyl-2-hydro peroxide, diisopropylbenzenehydro peroxide, cumenehydro peroxide, t-butylhydro peroxide, and the like; dialkyl peroxides such as dicumyl peroxide, 2,5-dimethyl-2,5-di(t-butylperoxy)hexane, 1,3-bis(t-butyloxyisopropyl)benzene, t-butylperoxyvaleric acid n-butylester, and the like; alkyl peresters such as 2,4,4-trimethylpentyl peroxyphenoxyacetate, α-cumyl peroxyneodecanoate, t-butyl peroxybenzoate, di-t-butyl peroxytrimethyladipate, and the like; percarbonates such as di-3-methoxybutyl peroxydicarbonate, di-2-ethylhexyl peroxydicarbonate, bis-4-t-butylcyclohexyl peroxydicarbonate, diisopropyl peroxydicarbonate, acetylcyclohexylsulfonyl peroxide, t-butyl peroxyarylcarbonate and the like; and the like, and combinations thereof.

Examples of the azobis-based compound may include without limitation 1,1'-azobiscyclohexane-1-carbonitrile, 2,2'-azobis(2,4-dimethylvaleronitrile), 2,2,-azobis(methylisobutyrate), 2,2'-azobis(4-methoxy-2,4-dimethylvaleronitrile), α,α'-azobis(isobutylnitrile), 4,4'-azobis(4-cyanovaleric acid), and the like, and combinations thereof.

The initiator may be used with a photosensitizer capable of causing a chemical reaction by absorbing light and becoming excited and then transferring its energy.

Examples of the photosensitizer may include without limitation tetraethylene glycol bis-3-mercapto propionate, pentaerythritol tetrakis-3-mercapto propionate, dipentaerythritol tetrakis-3-mercapto propionate, and the like, and combinations thereof.

The photosensitive resin composition may include the initiator in an amount of about 0.01 wt % to about 10 wt %, for example about 0.1 wt % to about 5 wt %, based on the total amount (total weight or 100 wt %) of the photosensitive resin composition. In some embodiments, the photosensitive resin composition may include the initiator in an amount of about 0.01, 0.02, 0.03, 0.04, 0.05, 0.06, 0.07, 0.08, 0.09, 0.1, 0.2, 0.3, 0.4, 0.5, 0.6, 0.7, 0.8, 0.9, 1, 2, 3, 4, 5, 6, 7, 8, 9, or 10 wt %. Further, according to some embodiments of the present invention, the amount of the initiator can be in a range from about any of the foregoing amounts to about any other of the foregoing amounts.

When the initiator is included in an amount within the above range, excellent reliability may be secured due to sufficiently curing during exposure in a pattern-forming process, a pattern may have excellent resolution and/or close-contacting properties as well as excellent heat resistance, light resistance, and chemical resistance, and transmittance may be prevented from deterioration due to a non-reaction initiator.

(D) Pigment

The pigment may be used in a pigment dispersion form with a dispersing agent and a solvent which are post-described.

The pigment may include an organic pigment and/or an inorganic pigment.

Examples of the pigment may include without limitation red pigments, green pigments, blue pigments, yellow pigments, black pigments and the like, and combinations thereof.

Examples of the red pigment may include without limitation C.I. red pigment 254, C.I. red pigment 255, C.I. red pigment 264, C.I. red pigment 270, C.I. red pigment 272, C.I. red pigment 177, C.I. red pigment 89, and the like and combinations thereof. Examples of the green pigment may include without limitation halogen-substituted copper phthalocyanine pigments such as C.I. green pigment 36, C.I. green pigment 7, and the like and combinations thereof. Examples of the blue pigment may include without limitation copper phthalocyanine pigments such as C.I. blue pigment 15:6, C.I.

blue pigment 15, C.I. blue pigment 15:1, C.I. blue pigment 15:2, C.I. blue pigment 15:3, C.I. blue pigment 15:4, C.I. blue pigment 15:5, C.I. blue pigment 16, and the like and combinations thereof. Examples of the yellow pigment may include without limitation isoindoline-based pigments such as C.I. yellow pigment 139, and the like, quinophthalone-based pigments such as C.I. yellow pigment 138, and the like, nickel complex pigments such as C.I. yellow pigment 150, and the like and combinations thereof. Examples of the black pigment may include without limitation aniline black, perylene black, titanium black, carbon black, and the like and combinations thereof. The pigment may be used singularly or as a mixture of two or more, but is not limited thereto.

Among these pigments, the black pigment may be used to perform efficient light blocking of a light blocking layer. The black pigment may be used with a color calibrator. Examples of the color calibrator can include without limitation anthraquinone-based pigments, perylene-based pigments, phthalocyanine-based pigments, azo-based pigments, and the like, and combinations thereof.

The photosensitive resin composition may further include a dispersing agent in order to improve dispersion of the pigment. The pigment may be surface-pretreated with a dispersing agent, or the pigment and dispersing agent may be added together during preparation of the photosensitive resin composition.

Examples of the dispersing agent may include without limitation non-ionic dispersing agents, anionic dispersing agents, cationic dispersing agents, and the like, and combinations thereof. Specific examples of the dispersing agent may include without limitation polyalkylene glycols and esters thereof, polyoxyalkylene, polyhydric alcohol ester alkylene oxide addition products, alcohol alkylene oxide addition products, sulfonate esters, sulfonate salts, carboxylate esters, carboxylate salts, alkylamide alkylene oxide addition products, alkyl amines, and the like, and may be used singularly or as a mixture of two or more.

Commercially available examples of the dispersing agent may include without limitation DISPERBYK-101, DISPERBYK-130, DISPERBYK-140, DISPERBYK-160, DISPERBYK-161, DISPERBYK-162, DISPERBYK-163, DISPERBYK-164, DISPERBYK-165, DISPERBYK-166, DISPERBYK-170, DISPERBYK-171, DISPERBYK-182, DISPERBYK-2000, DISPERBYK-2001, and the like made by BYK Co., Ltd.; EFKA-47, EFKA-47EA, EFKA-48, EFKA-49, EFKA-100, EFKA-400, EFKA-450, and the like made by EFKA Chemicals Co.; Solsperse 5000, Solsperse 12000, Solsperse 13240, Solsperse 13940, Solsperse 17000, Solsperse 20000, Solsperse 24000GR, Solsperse 27000, Solsperse 28000, and the like made by Zeneka Co.; PB711, PB821, and the like made by Ajinomoto Inc., and the like, and combinations thereof.

The dispersing agent may be included in an amount of about 0.1 to about 15 wt % based on the total weight of the photosensitive resin composition. When the dispersing agent is included in an amount within the above range, the photosensitive resin composition can have excellent dispersion property and thus may form a light blocking layer having excellent stability, developability, and/or pattern-forming capability.

The pigment may be pre-treated using a water-soluble inorganic salt and a wetting agent. When the pigment is pre-treated, a primary particle of the pigment may become finer.

The pre-treatment may be performed by kneading the pigment with a water-soluble inorganic salt and a wetting agent and then, filtering and washing the knead pigment.

The kneading may be performed at a temperature of about 40° C. to about 100° C., and the filtering and washing may be performed by filtering the pigment after washing away an inorganic salt with water and the like.

Examples of the water-soluble inorganic salt may include without limitation sodium chloride, potassium chloride, and the like. The wetting agent may make the pigment to be uniformly mixed with the water-soluble inorganic salt uniformly and be pulverized. Examples of the wetting agent may include without limitation alkylene glycol monoalkyl ethers such as ethylene glycol monoethylether, propylene glycol monomethylether, diethylene glycol monomethylether, and the like, and alcohols such as ethanol, isopropanol, butanol, hexanol, cyclohexanol, ethylene glycol, diethylene glycol, polyethylene glycol, glycerine polyethylene glycol, and the like. These may be used singularly or as a mixture of two or more.

The pigment after the kneading may have an average particle diameter of about 30 nm to about 100 nm. When the pigment has an average particle diameter within the above range, a fine pattern having excellent heat resistance and/or light resistance may be effectively formed.

The photosensitive resin composition may include the pigment may be included in an amount of about 1 wt % to about 50 wt %, for example, about 2 wt % to about 45 wt %, based on the total amount (total weight or 100 wt %) of the photosensitive resin composition. In some embodiments, the photosensitive resin composition may include the pigment in an amount of about 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, or 50 wt %. Further, according to some embodiments of the present invention, the amount of the pigment can be in a range from about any of the foregoing amounts to about any other of the foregoing amounts.

When the pigment is included in an amount within the above range, a pattern having excellent color reproducibility, curing properties, and/or close-contacting properties may be obtained.

(E) Solvent

The solvent is a material having compatibility with the cardo-based resin, the reactive unsaturated compound, the pigment, and the initiator but not reactive therewith.

Examples of the solvent may include without limitation alcohols such as methanol, ethanol, and the like; ethers such as dichloroethyl ether, n-butyl ether, diisoamyl ether, methylphenyl ether, tetrahydrofuran, and the like; glycol ethers such as ethylene glycol monomethylether, ethylene glycol monoethylether, and the like; cellosolve acetates such as methyl cellosolve acetate, ethyl cellosolve acetate, diethyl cellosolve acetate, and the like; carbitols such as methylethyl carbitol, diethyl carbitol, diethylene glycol monomethylether, diethylene glycol monoethylether, diethylene glycol dimethylether, diethylene glycol methylethylether, diethylene glycol diethylether, and the like; propylene glycol alkylether acetates such as propylene glycol methylether acetate, propylene glycol propylether acetate, and the like; aromatic hydrocarbons such as toluene, xylene and the like; ketones such as methylethylketone, cyclohexanone, 4-hydroxy-4-methyl-2-pentanone, methyl-n-propylketone, methyl-n-butylketone, methyl-n-amylketone, 2-heptanone, and the like; saturated aliphatic monocarboxylic acid alkyl esters such as ethyl acetate, n-butyl acetate, isobutyl acetate, and the like; lactate esters such as methyl lactate, ethyl lactate, and the like; oxy acetic acid alkyl esters such as oxy methyl acetate, oxy ethyl acetate, butyl oxyacetate, and the like; alkoxy acetic acid alkyl esters such as methoxy methyl acetate, methoxy ethyl acetate, methoxy butyl acetate, ethoxy methyl acetate, ethoxy ethyl acetate, and the like; 3-oxy propionic acid alkyl esters such as 3-oxy methyl propionate, 3-oxy ethyl propionate, and the like; 3-alkoxy propionic acid alkyl esters such as 3-methoxy methyl propionate, 3-methoxy ethyl propionate, 3-ethoxy ethyl propionate, 3-ethoxy methyl propionate, and the like; 2-oxy propionic acid alkyl esters such as 2-oxy methyl propionate, 2-oxy ethyl propionate, 2-oxy propyl propionate, and the like; 2-alkoxy propionic acid alkyl esters such as 2-methoxy methyl propionate, 2-methoxy ethyl propionate, 2-ethoxy ethyl propionate, 2-ethoxy methyl propionate, and the like; 2-oxy-2-methyl propionic acid esters such 2-oxy-2-methyl methyl propionate, 2-oxy-2-methyl ethyl propionate, and the like, monooxy monocarboxylic acid alkyl esters of 2-alkoxy-2-methyl alkyl propionates such as 2-methoxy-2-methyl methyl propionate, 2-ethoxy-2-methyl ethyl propionate, and the like; esters such as 2-hydroxy ethyl propionate, 2-hydroxy-2-methyl ethyl propionate, hydroxy ethyl acetate, 2-hydroxy-3-methyl methyl butanoate, and the like; ketonate esters such as ethyl pyruvate, and the like and combinations thereof. Additionally, high boiling point solvents such as N-methylformamide, N,N-dimethylformamide, N-methylformanilide, N-methylacetamide, N,N-dimethylacetamide, N-methylpyrrolidone, dimethylsulfoxide, benzylethylether, dihexylether, acetylacetone, isophorone, caproic acid, caprylic acid, 1-octanol, 1-nonanol, benzylalcohol, benzyl acetate, ethyl benzoate, diethyl oxalate, diethyl maleate, γ-butyrolactone, ethylene carbonate, propylene carbonate, phenyl cellosolve acetate, and the like and combinations thereof may be also used.

Considering miscibility and reactivity, glycol ethers such as ethylene glycol monoethylether, and the like; ethylene glycol alkylether acetates such as ethyl cellosolve acetate, and the like; esters such as 2-hydroxy ethyl propionate, and the like; carbitols such as diethylene glycol monomethylether, and the like; propylene glycol alkylether acetates such as propylene glycol methylether acetate, propylene glycol propylether acetate and the like and combinations thereof may be used.

The photosensitive resin composition may include the solvent in a balance amount, for example about 40 wt % to about 90 wt %, and as another example about 50 wt % to about 90 wt %, based on the total amount (total weight or 100 wt %) of the photosensitive resin composition. In some embodiments, the photosensitive resin composition may include the solvent in an amount of about 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, 80, 81, 82, 83, 84, 85, 86, 87, 88, 89, or 90 wt %. Further, according to some embodiments of the present invention, the amount of the solvent can be in a range from about any of the foregoing amounts to about any other of the foregoing amounts.

When the solvent is included in an amount within the above range, the photosensitive resin composition may have an appropriate viscosity resulting in improvement of coating characteristics of a light blocking layer.

(F) Other Additive(s)

The photosensitive resin composition may further include an epoxy compound in order to improve close-contacting (adhesive) properties with a substrate.

The photosensitive resin composition may further include malonic acid; 3-amino-1,2-propanediol; a silane-based coupling agent having a vinyl group or a (meth)acryloxy group; a leveling agent; a surfactant; a radical polymerization initiator; or a combination thereof in order to improve close-contacting properties with a substrate.

Examples of the epoxy compound may include without limitation phenol novolac epoxy compounds, tetramethyl biphenyl epoxy compounds, bisphenol A epoxy compounds, alicyclic epoxy compounds, and the like, and combinations thereof.

The epoxy compound may be included in an amount of about 0.01 to about 20 parts by weight, for example, about 0.1 to about 10 parts by weight, based on about 100 parts by weight of the photosensitive resin composition. When the epoxy compound is included in an amount within the above range, a close-contacting properties, a storage property, and the like may be improved.

In addition, the photosensitive resin composition may further include a silane coupling agent having a reactive substituent such as a carboxyl group, a methacryloyl group, an isocyanate group, an epoxy group, and the like to improve its adherence to a substrate.

Examples of the silane-based coupling agent may include without limitation trimethoxysilyl benzoic acid, γ-methacryl oxypropyl trimethoxysilane, vinyl triacetoxysilane, vinyl trimethoxysilane, γ-iso cyanate propyl triethoxysilane, γ-glycidoxy propyl trimethoxysilane, β-(3,4-epoxycyclohexyl)ethyltrimethoxysilane, and the like. These may be used singularly or in a mixture of two or more.

The silane-coupling agent may be included in an amount of about 0.01 to about 10 parts by weight based on about 100 parts by weight of the photosensitive resin composition. When the silane-coupling agent is included in an amount within the above range, close-contacting properties, storing property, and the like may be excellent.

In addition, the photosensitive resin composition may further include a surfactant to improve coating and prevent a defect if necessary.

Examples of the surfactant may include without limitation commercial fluorine-based surfactants such as BM-1000®, and BM-1100® (BM Chemie Inc.); MEGAFACE F 142D®, F 172®, F 173®, and F 183® (Dainippon Ink Kagaku Kogyo Co., Ltd.); FULORAD FC-135®, FULORAD FC-170C®, FULORAD FC-430®, and FULORAD FC-431® (Sumitomo 3M Co., Ltd.); SURFLON S-112®, SURFLON S-113®, SURFLON S-131®, SURFLON S-141®, and SURFLON S-145® (Asahi Glass Co., Ltd.); and SH-28PA®, SH-190®, SH-193®, SZ-6032®, and SF-8428® (Toray Silicone Co., Ltd.) and the like, and combinations thereof.

The surfactant may be used in an amount of about 0.001 to about 5 parts by weight based on about 100 parts by weight of the photosensitive resin composition. When the surfactant is included in an amount within the above range, excellent wetting on a glass substrate as well as coating uniformity may be secured, but a stain may not be produced.

Furthermore, the photosensitive resin composition may include one or more other additives such as an antioxidant, a stabilizer, and the like in a predetermined amount unless they deteriorate properties of the photosensitive resin composition.

According to another embodiment, a light blocking layer manufactured using the photosensitive resin composition is provided. The light blocking layer may be manufactured as follows.

(1) Coating and Film Formation

The photosensitive resin composition can be coated to have a desired thickness, for example, a thickness of about 0.5 μm to about 25 μm, on a substrate which undergoes a predetermined pretreatment, using a spin or slit coating method, a roll coating method, a screen-printing method, an applicator method, and the like. Then, the coated substrate can be heated at a temperature of about 70° C. to about 110° C. for about 1 minute to about 10 minutes to remove a solvent.

(2) Exposure

The resultant film can be radiated by an active ray of about 190 nm to about 500 nm after putting a mask with a predetermined shape to form a desired pattern.

The radiation can be performed by using a light source such as a mercury lamp with a low pressure, a high pressure, or an ultra high pressure, a metal halide lamp, an argon gas laser, and the like. An X ray, an electron beam, and the like may be also used.

The exposure process can use, for example, a light dose of about 500 mJ/cm$^2$ or less (with a 365 nm sensor) when a high pressure mercury lamp is used. However, the light dose may vary depending on the kinds of each component of the photosensitive resin composition, their combination ratio, and dry film thickness.

(3) Development

After the exposure process, an alkali aqueous solution can be used to develop the exposed film by dissolving and removing an unnecessary part except the exposed part, forming an image pattern.

(4) Post-Treatment

The developed image pattern may be heated again or radiated by an active ray and the like for curing, in order to accomplish excellent quality in terms of heat resistance, photo resistance, close-contacting properties, crack-resistance, chemical resistance, high strength, storage stability, and the like.

Therefore, the above photosensitive resin composition may provide a pattern that can have improved high close-contacting force and/or resolution required for a light blocking layer.

Hereinafter, the present invention is illustrated in more detail with reference to the following examples. These examples, however, are not in any sense to be interpreted as limiting the scope of the invention.

(Preparation of Binder Resin)

PREPARATION EXAMPLE 1-1

(1) A compound represented by the following Chemical Formula 8-1 is synthesized by putting 138 g of 9,9'-bis(4-glycidoxy phenyl)fluorene (Hear Chem), 54 g of acrylic acid, 1.4 g of benzyltriethylammonium chloride (Daejung Chemicals & Metals Co., Ltd.), 1 g of triphenyl phosphine (Aldrich Corp.), 128 g of propylene glycolmethylethylacetate (Daicel Chemical Industries Ltd.), and 0.5 g of hydroquinone in a reactor and then, heating the mixture up to 120° C. and maintaining it for 12 hours.

[Chemical Formula 8-1]

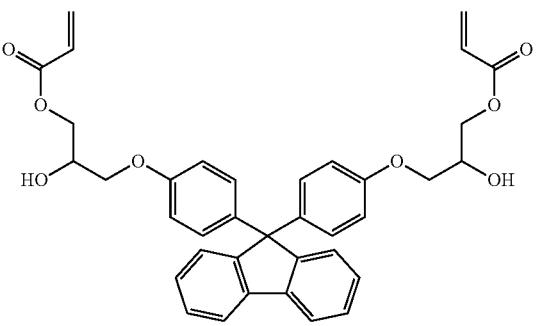

(2) A compound represented by the following Chemical Formula 8-2 is synthesized by putting 60 g of the compound represented by the above Chemical Formula 8-1, 16 g of biphenyltetracarboxylic acid dianhydride (Mitsubishi Gas Chemical Co., Ltd.), 3.4 g of tetrahydrophthalic anhydride (Aldrich Corp.), 20 g of propylene glycolmethylethylacetate (Daicel Chemical Industries Ltd.), and 0.1 g of N,N'-tetramethylammonium chloride in a reactor and then, heating the mixture up to 120° C. and maintaining it for 2 hours. The obtained compound represented by Chemical Formula 8-2 has a weight average molecular weight of 5,400 g/mol.

[Chemikcal Formula 8-2]

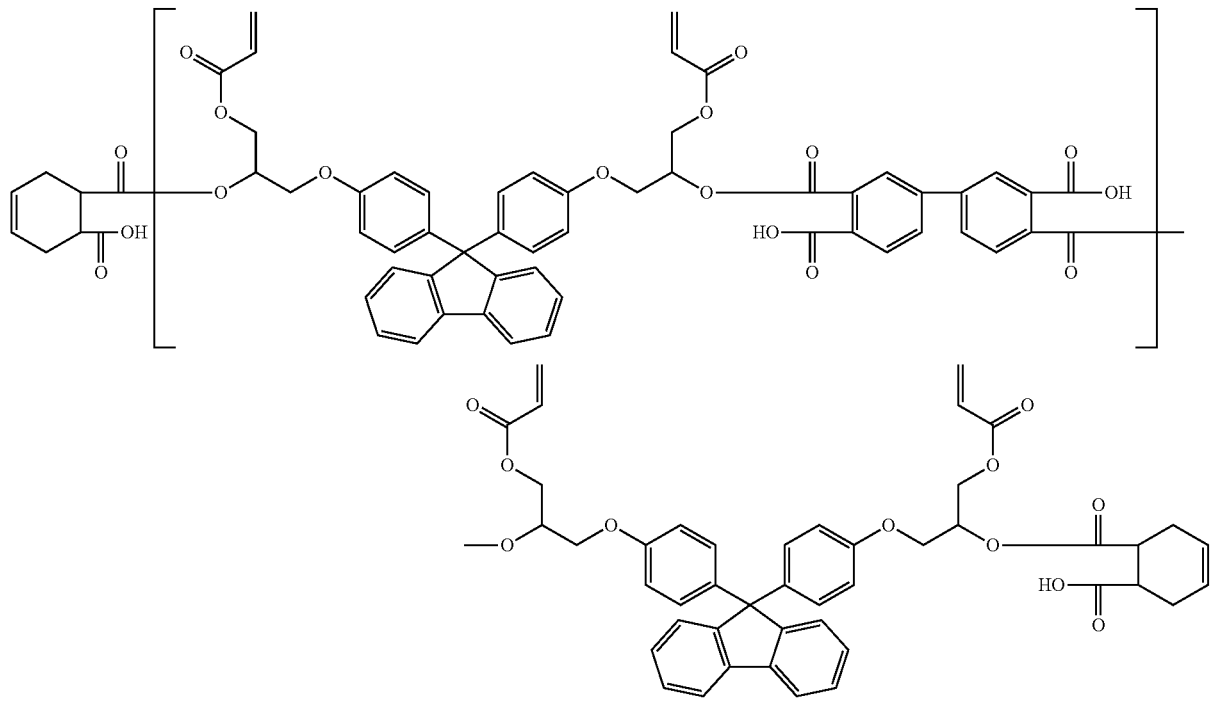

PREPARATION EXAMPLE 1-2

A compound represented by the following Chemical Formula 8-3 is synthesized by putting 75 g of the compound represented by the above Chemical Formula 8-2, 10 g of butyl glycidyl ether (Aldrich Corp.), and 0.4 g of triphenylphosphine (Aldrich Corp.) and then, heating the mixture up to 100° C. and maintaining it for 3 hours. The obtained compound represented by Chemical Formula 8-3 has a weight average molecular weight of 5,600 g/mol.

[Chemical Formula 8-3]

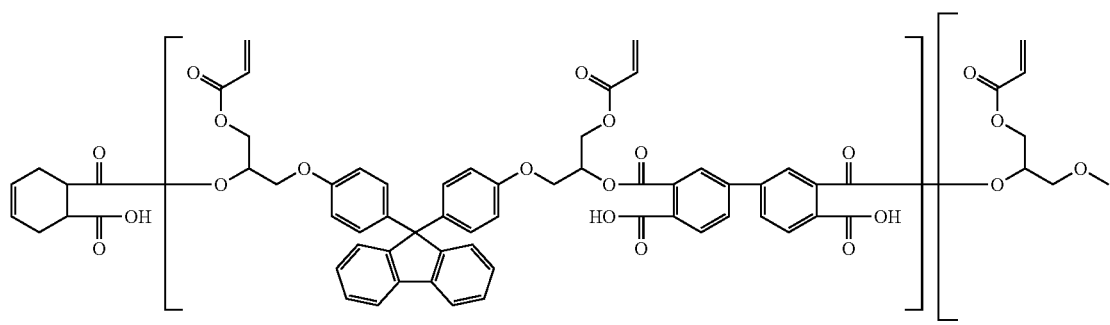

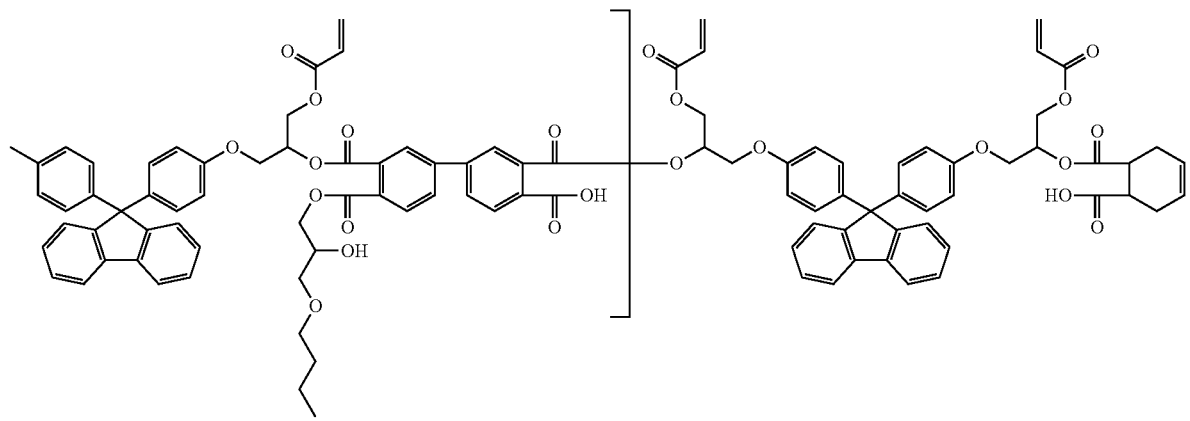

PREPARATION EXAMPLE 1-3

(1) A phosphorus-based epoxy compound represented by the following Chemical Formula 8-4 is obtained by putting 25 g of diethylvinylphosphonate (Aldrich Corp.), 11.3 g of glycidol (Aldrich Corp.), and 9.9 g of cesium carbonate (Aldrich Corp.) in a reactor, reacting the mixture at 50° C. for 5 hours and cooling down it to room temperature, putting the reaction solution into 200 g of water, and silica gel column-treating the resultant solution obtained after extraction by using 300 g of methylenechloride (Aldrich Corp.) and distillation under a reduced pressure.

[Chemical Formula 8-4]

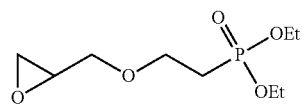

(2) A compound represented by the following Chemical Formula 8-5 is synthesized by putting 75 g of the compound represented by the above Chemical Formula 8-2, 10 g of the compound represented by the above Chemical Formula 8-4, and 0.4 g of triphenylphosphine (Aldrich Corp.) and then, heating the mixture up to 100° C. and maintaining it for 3 hours. The compound represented by Chemical Formula 8-5 has a weight average molecular weight of 5,600 g/mol.

[Chemical Formula 8-5]

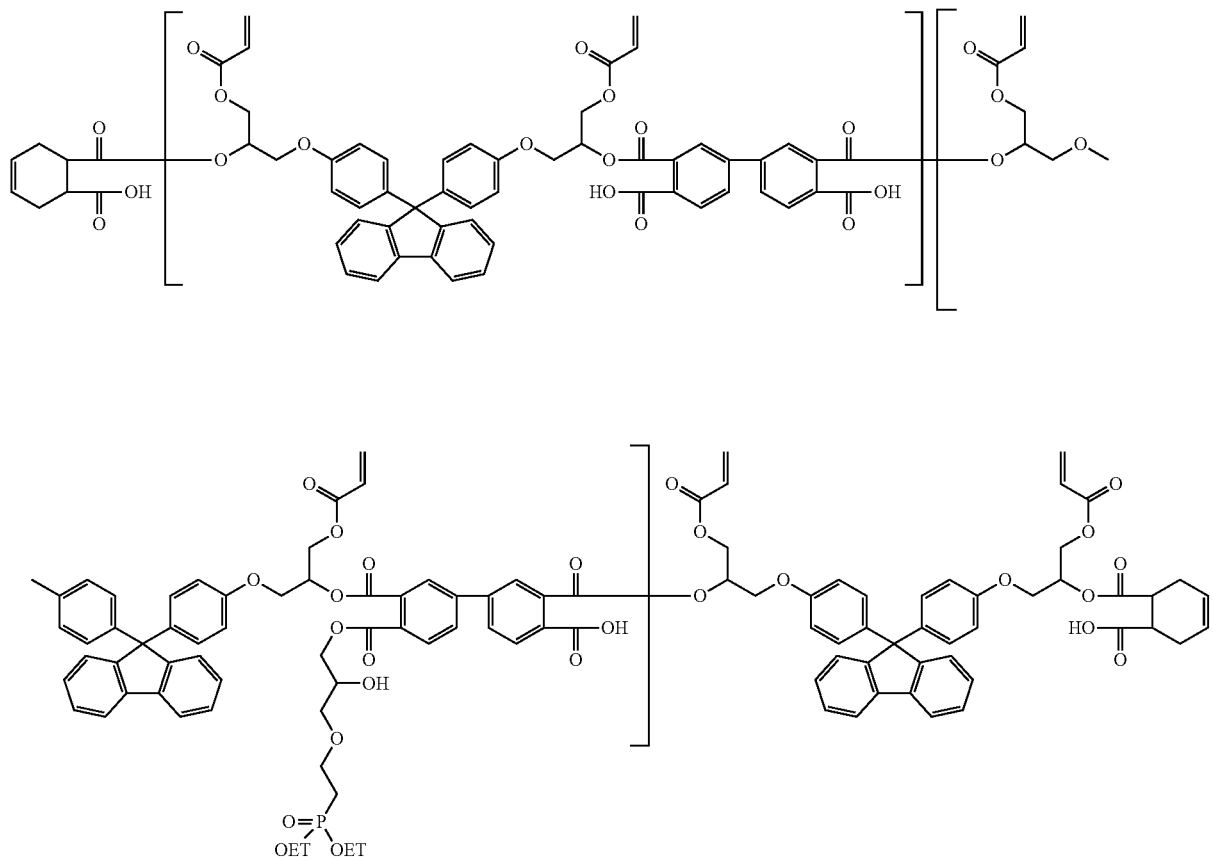

PREPARATION EXAMPLE 3-1

(1) A compound represented by the following Chemical Formula 26 is synthesized by putting 50 g of trimellitic anhydride chloride (TCl), 47 g of diethyl hydroxymethylphosphonate (Aldrich Corp.), 200 ml of DMF (Aldrich Corp.), and 200 ml of pyridine (Aldrich Corp.) in a reactor and then, heating the reactor up to 50° C. and maintaining it for 12 hours.

[Chemical Formula 26]

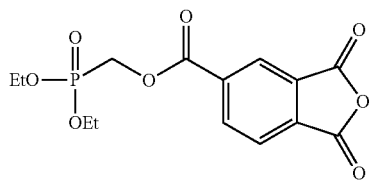

(2) A compound represented by the following Chemical Formula 27 is synthesized by putting 50 g of trimellitic anhydride chloride (TCl), 45 g of diethyl (2-hydroxyethyl)phosphonate (TCl), 200 ml of DMF (Aldrich Corp.), and 200 ml of pyridine (Aldrich Corp.) and then, heating the reactor up to 50° C. and maintaining it for 12 hours.

[Chemical Formula 27]

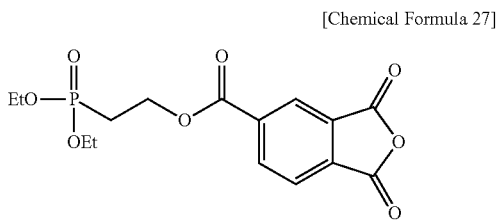 [SMILES: CCOP(=O)(CCOC(=O)c1ccc2c(c1)C(=O)OC2=O)OCC]

(3) A compound represented by the following Chemical Formula 28 is synthesized by putting 58 g of the compound represented by the above Chemical Formula 8-1, 2 g of the compound represented by the above Chemical Formula 26, 14 g of bisphenyltetracarboxylic acid dianhydride, 130 g of propyleneglycolmethylethylacetate, and 0.03 g of N,N'-tetramethylammonium chloride in a reactor and then, heating the reactor up to 120° C. and maintaining it for 10 hours. The compound represented by Chemical Formula 28 has a weight average molecular weight of 3,800 g/mol.

[Chemical Formula 28]

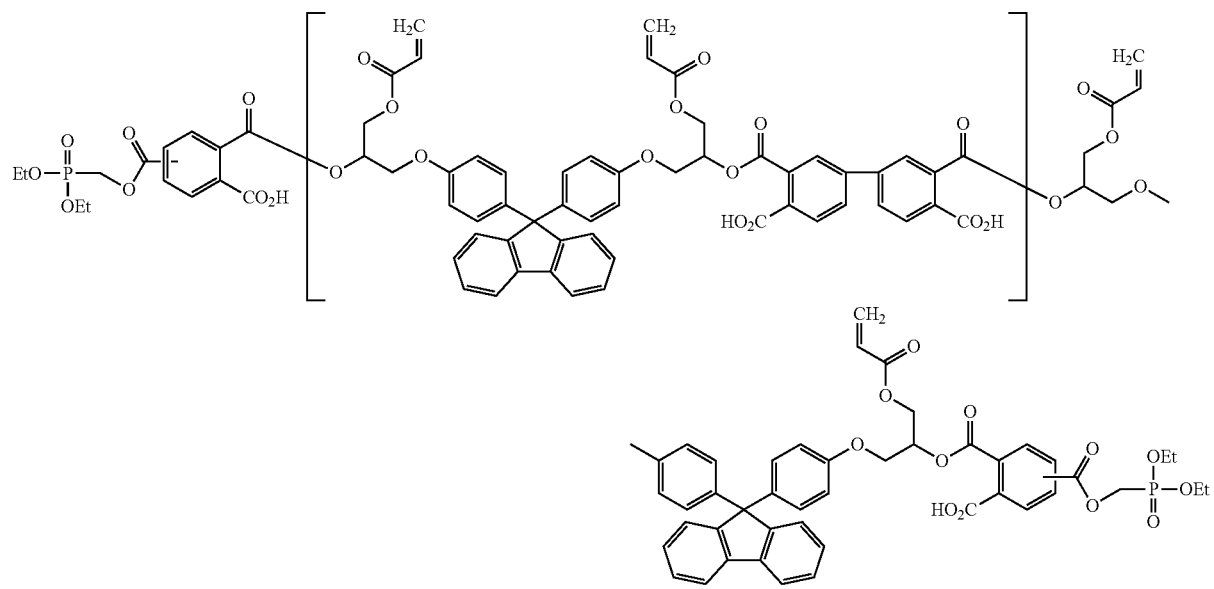

PREPARATION EXAMPLE 3-2

A compound represented by the following Chemical Formula 29 is synthesized by putting 55 g of the compound represented by the above Chemical Formula 8-1, 3.5 g of the compound represented by the above Chemical Formula 27, 30 g of 4,4'-(9-Fluorenylidene)bis(2-phenoxyethanol), 24 g of bisphenyltetracarboxylic acid dianhydride (Mitsubishi Gas Chemical Co. Ltd.), 130 g of propyleneglycolmethylethylacetate (Daicel Chemical Industries Ltd.), and 0.03 g of N,N'-tetramethylammonium chloride in a reactor and then, heating the reactor up to 120° C. and maintaining it for 12 hours. The compound represented by Chemical Formula 29 has a weight average molecular weight of 4,300 g/mol.

(Preparation of Pigment Dispersion)

PREPARATION EXAMPLE 2-1

Preparation of Red Pigment Dispersion

A red pigment dispersion is prepared by mixing 15 g of a C.I. pigment 254 (BT-CF, BASF Corp.), 4 g of DISPERBYK-163 (BYK), 3 g of an acrylic acid/benzylmethacrylate copolymer (NPR8000, Miwon Commercial Co., Ltd,) and 78 g of propylene glycol methylethylacetate in a reactor and dispersing the mixture by using a paint-shaker (Asada Iron Works Co., Ltd.) for 12 hours.

[Chemical Formula 29]

PREPARATION EXAMPLE 2-2

Preparation of Black Pigment Dispersion

A black pigment dispersion is prepared by mixing 15 g of carbon black (VULCAN® XC72R, Cabot Corp.), 4 g of DISPERBYK-163 (BYK), 3 g of acrylic acid/benzylmethacrylate copolymer (NPR8000, Miwon Commercial Co., Ltd.), and 78 g of propylene glycol methylethylacetate in a reactor and dispersing the mixture by using a paint-shaker (Asada Iron Works Co., Ltd.) for 12 hours.
(Preparation of Photosensitive Resin Composition 1)

EXAMPLES 1 TO 4 AND COMPARATIVE EXAMPLES 1 TO 4

Photosensitive resin compositions according to Examples 1 to 4 and Comparative Examples 1 to 4 are respectively prepared by using the following components in a composition provided in the following Table 1

Specifically, an initiator is dissolved in a solvent, a binder resin and a reactive unsaturated compound are added thereto after agitating the solution at room temperature for 2 hours, and the resulting mixture is agitated at room temperature for 2 hours. Subsequently, the red pigment dispersion according to Preparation Example 2-1 or the black pigment dispersion according to Preparation Example 2-2 and a silane coupling agent are added to the obtained reactant, and the mixture is agitated at room temperature for one hour. Subsequently the product is 3 times filtered to remove impurities, preparing a photosensitive resin composition.

(A) Binder Resin (A-1) The compound represented by Chemical Formula 8-2 according to Preparation Example 1-1 as a cardo-based resin is used.

(A-2) The compound represented by Chemical Formula 8-3 according to Preparation Example 1-2 as a cardo-based resin is used.

(A-3) The compound represented by Chemical Formula 8-5 according to Preparation Example 1-3 as a cardo-based resin is used.

(A-4) V259ME manufactured by Nippon Steel Chemical. Co., Ltd. as a cardo-based resin is used.

(B) Reactive Unsaturated Compound
Dipentaerythritol hexaacrylate is used.

(C) Initiator
IRGACURE OXE02 manufactured by Ciba-Geigy is used.

(D) Pigment Dispersion (D-1) the red pigment dispersion according to Preparation Example 2-1 is used. Herein, a pigment solid is included in an amount of 15 wt % based on total amount of the red pigment dispersion.

(D-2) The black pigment dispersion according to Preparation Example 2-2 is used. Herein, a pigment solid is included in an amount of 15 wt % based on total amount of the black pigment dispersion.

(E) Solvent
Propylene glycol methylether acetate is used.

(F) Additive
γ-glycidoxy propyl trimethoxysilane (S-510, Chisso Corp.) as a silane-based coupling agent is used.

TABLE 1

(unit: wt %)

|  |  | Examples | | | | Comparative Examples | | | |
|---|---|---|---|---|---|---|---|---|---|
|  |  | 1 | 2 | 3 | 4 | 1 | 2 | 3 | 4 |
| (A) Binder resin (solid content 50%) | (A-1) | — | — | — | — | 9.5 | 9.5 | — | — |
|  | (A-2) | 9.5 | 9.5 | — | — | — | — | — | — |
|  | (A-3) | — | — | 9.5 | 9.5 | — | — | — | — |
|  | (A-4) | — | — | — | — | — | — | 9.5 | 9.5 |
| (B) Reactive unsaturated compound |  | 3.5 | 3.5 | 3.5 | 3.5 | 3.5 | 3.5 | 3.5 | 3.5 |
| (D) Pigment dispersion | (D-1) | 40 (6*) | — | 40 (6*) | — | 40 (6*) | — | 40 (6*) | — |
|  | (D-2) | — | 40 (6*) | — | 40 (6*) | — | 40 (6*) | — | 40 (6*) |
| (C) Initiator |  | 0.3 | 0.8 | 0.3 | 0.8 | 0.3 | 0.8 | 0.3 | 0.8 |
| (E) Solvent |  | 44.2 | 43.7 | 44.2 | 43.7 | 44.2 | 43.7 | 44.2 | 43.7 |
| (F) Additive |  | 2.5 | 2.5 | 2.5 | 2.5 | 2.5 | 2.5 | 2.5 | 2.5 |

*indicates solid content of a pigment based on the total amount of (D-1) a red pigment dispersion or (D-2) a black pigment dispersion.

(Preparation of Photosensitive Resin Composition 2)

EXAMPLES 5 TO 8 AND COMPARATIVE EXAMPLES 5 AND 6

The photosensitive resin compositions according to Examples 5 to 8 and Comparative Examples 5 and 6 are prepared by using the following components in a composition provided in the following Table 2.

Specifically, an initiator is dissolved in a solvent, a binder resin and a reactive unsaturated compound are added thereto after agitating the solution at room temperature for 2 hours, and the resulting mixture is agitated at room temperature for 2 hours. Subsequently, the red pigment dispersion of Preparation Example 2-1 or the black pigment dispersion of Preparation Example 2-2 and a silane coupling agent are added to the reactant, and the mixture is agitated at room temperature for one hour. Subsequently, the product is 3 times filtered to remove impurities, preparing a photosensitive resin composition.

(A) Binder Resin (A-4) V259ME made by Nippon Steel Chemical. Co., Ltd. is used as a cardo-based resin.

(A-5) The compound represented by Chemical Formula 28 in Preparation Example 3-1 is used as a cardo-based resin.

(A-6) The compound represented by Chemical Formula 29 in Preparation Example 3-2 is used as a cardo-based resin.

(B) Reactive Unsaturated Compound
Dipentaerythritol hexaacrylate is used.

(C) Initiator

IRGACURE OXE02 made by Ciba-Geigy Corp. is used.

(D) Pigment Dispersion (D-1) The red pigment dispersion according to Preparation Example 2-1 is used. Herein, a pigment solid is included in an amount of 15 wt % based on total amount of the red pigment dispersion.

(D-2) The black pigment dispersion according to Preparation Example 2-2 is used. Herein, a pigment solid is included in an amount of 15 wt % based on total amount of the black pigment dispersion.

(E) Solvent

Propylene glycol methylether acetate is used.

(F) Additive

γ-glycidoxy propyl trimethoxysilane (S-510, Chisso Corp.) is used as a silane coupling agent.

TABLE 2

(unit: wt %)

|  |  | Examples |  |  |  | Comparative Examples |  |
|---|---|---|---|---|---|---|---|
|  |  | 5 | 6 | 7 | 8 | 5 | 6 |
| (A) Binder resin (solid content 50%) | (A-4) | — | — | — | — | 9.5 | 9.5 |
|  | (A-5) | 9.5 | 9.5 | — | — | — | — |
|  | (A-6) | — | — | 9.5 | 9.5 | — | — |
| (B) Reactive unsaturated compound |  | 3.5 | 3.5 | 3.5 | 3.5 | 3.5 | 3.5 |
| (D) Pigment dispersion | (D-1) | 40 (6*) | — | 40 (6*) | — | 40 (6*) | — |
|  | (D-2) | — | 40 (6*) | — | 40 (6*) | — | 40 (6*) |
| (C) Initiator |  | 0.3 | 0.8 | 0.3 | 0.8 | 0.3 | 0.8 |
| (E) Solvent |  | 44.2 | 43.7 | 44.2 | 43.7 | 44.2 | 43.7 |
| (F) Additive |  | 2.5 | 2.5 | 2.5 | 2.5 | 2.5 | 2.5 |

(*indicates solid content of a pigment based on the total amount of (D-1) a red pigment dispersion or (D-2) a black pigment dispersion.)

Evaluation 1: Resolution

The photosensitive resin compositions according to Examples 1 to 8 and Comparative Examples 1 to 6 are respectively coated to be 1.3 μm high on each 10 cm*10 cm glass by using a spin coater (Opticoat MS-A150, Mikasa Co., Ltd.), soft-baked at 80° C. on a hot-plate for 150 seconds and exposed with 50 mJ by using an exposer (HB-50110AA, Ushio Inc.) and a photo mask. Subsequently, patterned glass specimens are obtained by developing the coated glass by using a developer (SSP-200 made by SVS) with a 0.2 wt % potassium hydroxide (KOH) aqueous solution and hard-baking it in an oven at 230° C. for 30 minutes. When the patterned specimens are examined with an optical microscope, samples realizing the finest line width are selected among the patterns having a thickness of greater than or equal to 1.3 μm by identifying their CDs (Critical Dimensions) and provided in the following Table 3 and Table 4.

Evaluation 2: Close-Contacting Force

The photosensitive resin compositions according to Examples 1 to 8 and Comparative Examples 1 to 6 are respectively coated to be 1.3 μm high on each 10 cm*10 cm glass with a spin coater (Opticoat MS-A150, Mikasa Co., Ltd.) and soft-baked on a hot-plate at 80° C. for 150 seconds, and being exposed with 50 mJ by using an exposer (HB-50110AA, Ushio Inc.) and a photo mask. Subsequently, the coated glass is developed by using a developer (SSP-200, SVS) and a 0.2 wt % potassium hydroxide (KOH) aqueous solution and hard-baking it in an oven at 230° C. for 30 minutes, obtaining a patterned specimen. The patterned glass specimens are cut into a size of 2 cm*2 cm, a Stud pin is fixed on the cut specimen with a mount clip, the specimens fixed with the Stud pin are heated at 150° C. for 30 minutes to fix them together, and the mount crip is removed. Close-contacting force of the specimens is evaluated by using UTM (Inspekt 10-1, Hegewald&Peschke), and the results are provided in the following Tables 3 and 4.

TABLE 3

|  | Minimum pattern size (resolution) (μm) | Close-contacting force to substrate (N) |
|---|---|---|
| Example 1 | 5.6 | 241 |
| Example 2 | 6.9 | 234 |
| Example 3 | 4.3 | 256 |
| Example 4 | 5.9 | 239 |
| Comparative Example 1 | 7.3 | 205 |
| Comparative Example 2 | 8.7 | 184 |

TABLE 3-continued

|  | Minimum pattern size (resolution) (μm) | Close-contacting force to substrate (N) |
|---|---|---|
| Comparative Example 3 | 7.7 | 196 |
| Comparative Example 4 | 8.5 | 172 |

Referring to Table 3, the photosensitive resin compositions of the Examples 1 to 4 using the binder resins of Preparation Examples 1-2 and 1-3 exhibit a finer line width and higher close-contacting force than the photosensitive resin compositions of Comparative Examples 1 to 4 using the binder resins of Preparation Examples 1-1 and binder resin A-4.

TABLE 4

|  | Minimum pattern size (resolution) (μm) | Close-contacting force to substrate (N) |
|---|---|---|
| Example 5 | 5.8 | 235 |
| Example 6 | 6.1 | 230 |
| Example 7 | 5.5 | 246 |
| Example 8 | 6.3 | 228 |
| Comparative Example 5 | 7.4 | 193 |
| Comparative Example 6 | 8.6 | 181 |

Referring to Table 4, the photosensitive resin compositions of Examples 5 to 8 using the binder resins of Preparation Examples 3-1 and 3-2 exhibit a finer line width and higher close-contacting force than the photosensitive resin compositions of Comparative Examples 5 to 6.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims. Therefore, the aforementioned embodiments should be understood to be exemplary but not limiting the present invention in any way.

What is claimed is:

1. A photosensitive resin composition, comprising:
   (A) a binder resin represented by the following Chemical Formula 1;
   (B) a reactive unsaturated compound;
   (C) an initiator;
   (D) a pigment; and
   (E) a solvent:

[Chemical Formula 1]

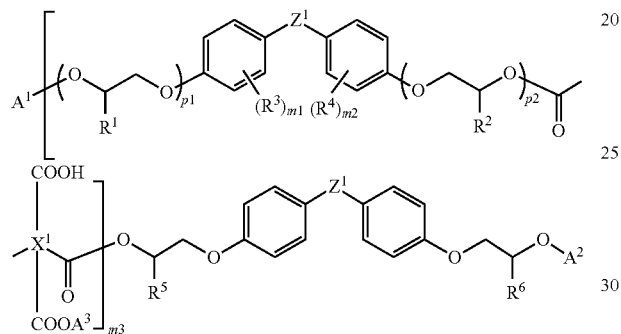

wherein, in the above Chemical Formula 1,
$A^1$ to $A^3$ are the same or different and are each independently hydrogen, represented by the following Chemical Formula 2-1, or represented by the following Chemical Formula 2-2, with the proviso that at least one of $A^1$ to $A^3$ is represented by the following Chemical Formula 2-1, and each $Z^1$ is the same or different and each is independently a single bond, O, CO, SO$_2$, CR'R", SiR'''R''''(wherein R' to R'''' are the same or different and are each independently hydrogen or substituted or unsubstituted C1 to C20 alkyl), or one of linking groups represented by the following Chemical Formulae 1-1 to 1-11,

[Chemical Formula 1-1]

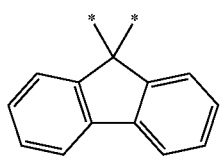

[Chemical Formula 1-2]

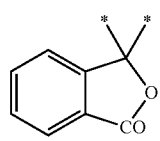

[Chemical Formula 1-3]

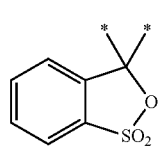

[Chemical Formula 1-4]

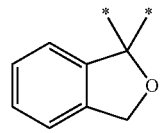

[Chemical Formula 1-5]

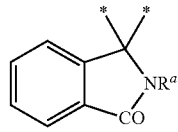

wherein, in the above Chemical Formula 1-5,
$R^a$ is hydrogen, ethyl, $C_2H_4C_1$, $C_2H_4OH$, $CH_2CH=CH_2$, or phenyl,

[Chemical Formula 1-6]

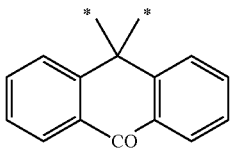

[Chemical Formula 1-7]

[Chemical Formula 1-8]

[Chemical Formula 1-9]

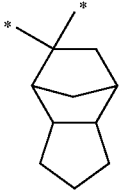

[Chemical Formula 1-10]

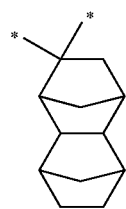

[Chemical Formula 1-11]

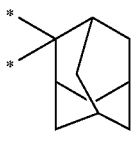

each $X^1$ is the same or different and each is independently an acid dianhydride residual group, R¹ to R⁶ are the same or different and are each independently hydrogen, halogen, substituted or unsubstituted C1 to C30 alkyl or substituted or unsubstituted (meth)acrylate, m1 and m2 are the same or different and are each independently integers of 0 to 4, m3 is an integer of 1 to 20, and p1 and p2 are the same or different and are each independently integers of 1 to 10,

[Chemical Formula 2-1]

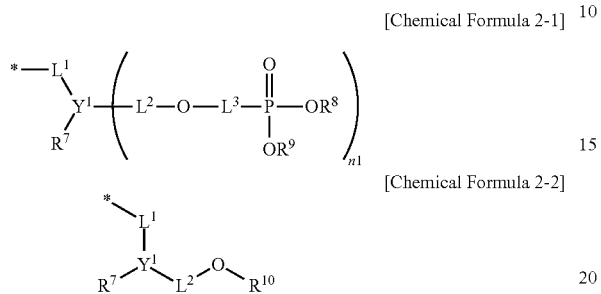

[Chemical Formula 2-2]

wherein, in the above Chemical Formulae 2-1 and 2-2,

R⁷ to R⁹ are the same or different and are each independently hydrogen, a hydroxy group, a carboxyl group, substituted or unsubstituted C1 to C30 alkyl or substituted or unsubstituted C6 to C30 aryl, R¹⁰ is substituted or unsubstituted C1 to C30 alkyl or substituted or unsubstituted C6 to C30 aryl, L¹ to L³ are the same or different and are each independently a single bond, a carbonyl group (—C(=O)—), substituted or unsubstituted C1 to C30 alkylene, or substituted or unsubstituted C6 to C30 arylene, Y¹ is a divalent or trivalent C1 to C30 aliphatic organic group, a divalent or trivalent C3 to C30 alicyclic organic group, a divalent or trivalent C6 to C30 aromatic organic group, or a combination thereof, and n1 is 1.

2. The photosensitive resin composition of claim 1, wherein the A¹ and A² are independently represented by the following Chemical Formula 3:

[Chemical Formula 3]

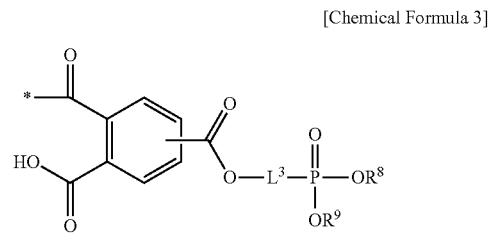

wherein, in the above Chemical Formula 3,

L³ is independently a single bond, a carbonyl group (—C(=O)—), substituted or unsubstituted C1 to C30 alkylene, or substituted or unsubstituted C6 to C30 arylene, and R⁸ and R⁹ are the same or different and are each independently a hydroxy group, a carboxyl group, substituted or unsubstituted C1 to C30 alkyl, or substituted or unsubstituted C6 to C30 aryl.

3. The photosensitive resin composition of claim 2, wherein the binder resin is represented by the following Chemical Formula 4 or Chemical Formula 5:

[Chemical Formula 4]

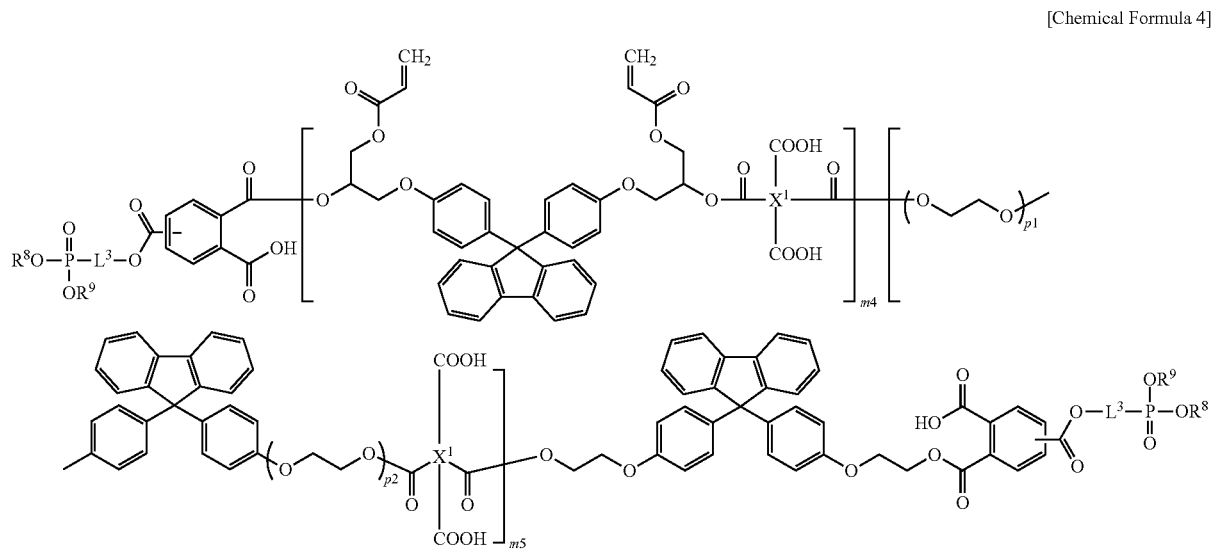

[Chemical Formula 5]

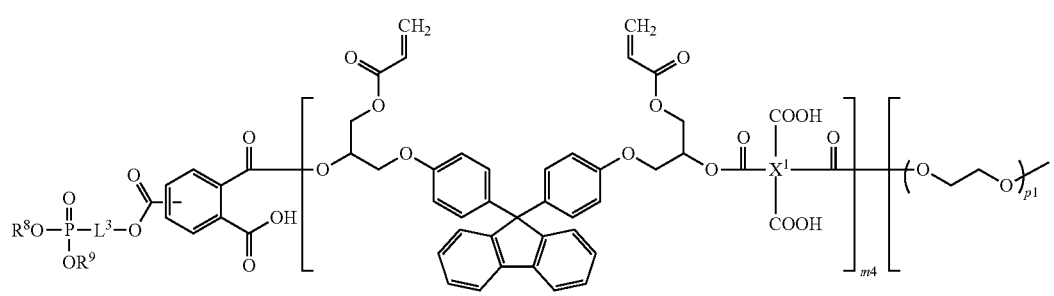

-continued

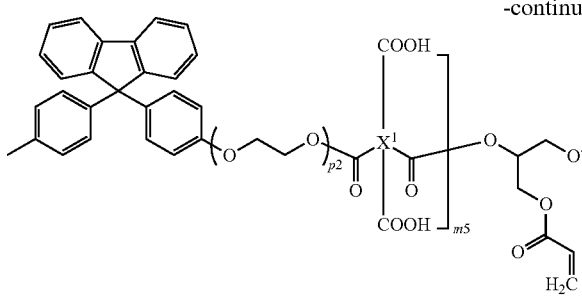 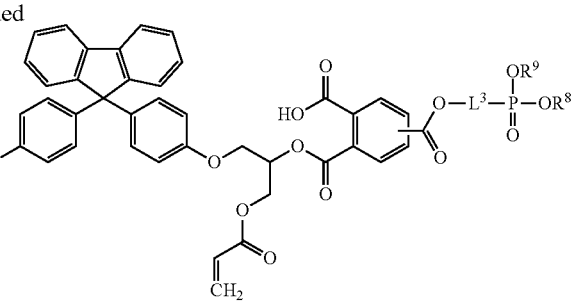

wherein, in the above Chemical Formulae 4 and 5,
each $X^1$ is the same or different and each is independently an acid dianhydride residual group,
each $L^3$ is the same or different and each is independently independently a single bond, a carbonyl group (—C(=O)—), substituted or unsubstituted C1 to C30 alkylene, or substituted or unsubstituted C6 to C30 arylene,
$R^8$ and $R^9$ are the same or different and are each independently a hydroxy group, a carboxyl group, substituted or unsubstituted C1 to C30 alkyl or substituted or unsubstituted C6 to C30 aryl,
m4 is an integer of 1 to 20,
m5 is an integer of 0 to 20, and
p1 and p2 are the same or different and are each independently integers of 1 to 10.

4. The photosensitive resin composition of claim 1, wherein the $A^3$ is represented by the following Chemical Formula 3 or Chemical Formula 6:

[Chemical Formula 3]

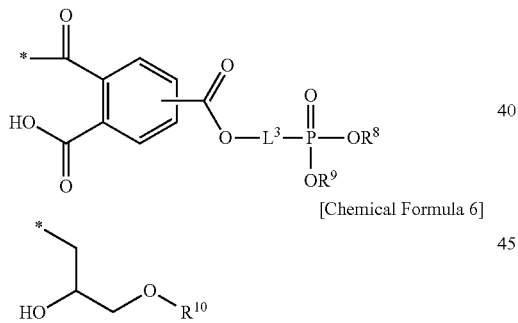

[Chemical Formula 6]

wherein, in the above Chemical Formulae 3 and 6,
$L^3$ is independently a single bond, a carbonyl group (—C(=O)—), substituted or unsubstituted C1 to C30 alkylene, or substituted or unsubstituted C6 to C30 arylene,
$R^8$ and $R^9$ are the same or different and are each independently a hydroxy group, a carboxyl group, substituted or unsubstituted C1 to C30 alkyl or substituted or unsubstituted C6 to C30 aryl, and
$R^{10}$ is substituted or unsubstituted C1 to C30 alkyl or substituted or unsubstituted C6 to C30 aryl.

5. The photosensitive resin composition of claim 1, wherein the binder resin has a weight average molecular weight of about 500 g/mol to about 50,000 g/mol.

6. The photosensitive resin composition of claim 1, wherein
in the above Chemical Formula 2-1,
n1 is an integer of 0, $Y^1$ is represented by the following Chemical Formulae 7-1 to 7-7:

[Chemical Formula 7-1]

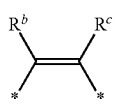

wherein, in the above Chemical Formula 7-1,
$R^b$ and $R^c$ are the same or different and are each independently hydrogen, substituted or unsubstituted C1 to C20 alkyl, an ester group, or an ether group,

[Chemical Formula 7-2]

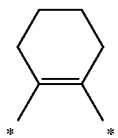

[Chemical Formula 7-3]

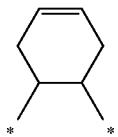

[Chemical Formula 7-4]

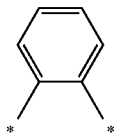

[Chemical Formula 7-5]

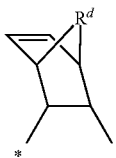

wherein, in the above Chemical Formula 7-5,
$R^d$ is O, S, NH, a substituted or unsubstituted C1 to C20 alkylene group, C1 to C20 alkylamine group, or a C2 to C20 allylamine group,

[Chemical Formula 7-6]

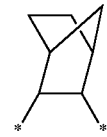

-continued

[Chemical Formula 7-7]

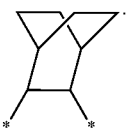

7. The photosensitive resin composition of claim 1, wherein the binder resin is a cardo-based resin.

8. The photosensitive resin composition of claim 7, wherein the photosensitive resin composition further comprises an acrylic resin selected from the group consisting of a acrylic acid/benzylmethacrylate copolymer, a methacrylic acid/benzylmethacrylate copolymer, a methacrylic acid/benzylmethacrylate/styrene copolymer, a methacrylic acid/benzylmethacrylate/2-hydroxyethylmethacrylate copolymer, a methacrylic acid/benzylmethacrylate/styrene/2-hydroxyethylmethacrylate copolymer, and mixtures thereof.

9. The photosensitive resin composition of claim 8, wherein the acrylic resin has a weight average molecular weight of about 3,000 g/mol to about 40,000 g/mol.

10. The photosensitive resin composition of claim 8, wherein the cardo-based resin and the acrylic resin are included in a weight ratio of about 99:1 to about 30:70.

11. The photosensitive resin composition of claim 1, wherein the initiator is a photopolymerization initiator, a radical polymerization initiator, or a combination thereof.

12. The photosensitive resin composition of claim 1, comprising:
   (A) about 1 wt % to about 30 wt % of the binder resin;
   (B) about 1 wt % to about 40 wt % of the reactive unsaturated compound;
   (C) about 0.01 wt % to about 10 wt % of the initiator;
   (D) about 1 wt % to about 50 wt % of the pigment; and
   (E) a balance amount of the solvent.

13. The photosensitive resin composition of claim 1, further comprising malonic acid; 3-amino-1,2-propanediol; a silane coupling agent having a vinyl group or a (meth)acryloxy group; a leveling agent; a surfactant; a radical polymerization initiator; or a combination thereof.

14. The photosensitive resin composition of claim 1, further comprising about 0.01 to about 20 parts by weight of an epoxy compound based on about 100 parts by weight of the photosensitive resin composition.

15. A light blocking layer manufactured using the photosensitive resin composition of claim 1.

* * * * *

UNITED STATES PATENT AND TRADEMARK OFFICE
CERTIFICATE OF CORRECTION

PATENT NO. : 9,268,217 B2
APPLICATION NO. : 14/244175
DATED : February 23, 2016
INVENTOR(S) : Seung-Hyun Kim et al.

Page 1 of 1

It is certified that error appears in the above-identified patent and that said Letters Patent is hereby corrected as shown below:

In the Claims

Claim 1, Column 38, Line 17 reads: "$R^a$ is hydrogen, ethyl, $C_2H_4C_1$, $C_2H_4OH$, $CH_2CH=CH_2$,"
and should read: "$R^a$ is hydrogen, ethyl, $C_2H_4Cl$, $C_2H_4OH$, $CH_2CH=CH_2$,"

Signed and Sealed this
Nineteenth Day of July, 2016

Michelle K. Lee
*Director of the United States Patent and Trademark Office*